US012127454B2

United States Patent
Han et al.

(10) Patent No.: US 12,127,454 B2
(45) Date of Patent: Oct. 22, 2024

(54) DISPLAY SUBSTRATE INCLUDING COMMON INITIALIZATION VOLTAGE SIGNAL LINE, DISPLAY PANEL, AND DISPLAY APPARATUS

(71) Applicant: BOE Technology Group Co., Ltd., Beijing (CN)

(72) Inventors: Ying Han, Beijing (CN); Pan Xu, Beijing (CN); Xing Zhang, Beijing (CN); Chengyuan Luo, Beijing (CN); Donghui Zhao, Beijing (CN); Mingi Chu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/261,880

(22) PCT Filed: Sep. 6, 2022

(86) PCT No.: PCT/CN2022/117276
§ 371 (c)(1),
(2) Date: Jul. 18, 2023

(87) PCT Pub. No.: WO2024/050687
PCT Pub. Date: Mar. 14, 2024

(65) Prior Publication Data
US 2024/0155893 A1 May 9, 2024

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0408* (2013.01);
(Continued)

(58) Field of Classification Search
CPC .................................................... H10K 59/131
See application file for complete search history.

(56) References Cited

U.S. PATENT DOCUMENTS 8,059,242 B2   11/2011   Onogi et al.
8,184,224 B2    5/2012   Asano et al.
(Continued)

FOREIGN PATENT DOCUMENTS

CN     100534250 C    8/2009
CN     102576162 A    7/2012
(Continued)

*Primary Examiner* — Chun-Nan Lin
(74) *Attorney, Agent, or Firm* — Westman, Champlin & Koehler, P.A.

(57) ABSTRACT

A display substrate includes: a base substrate, a plurality of pixel units and a plurality of initialization voltage signal lines. The pixel units are arranged in an array to form a plurality of rows of pixel units and a plurality of columns of pixel units, at least one pixel unit includes sub-pixels, and at least one sub-pixel includes a light-emitting element and a pixel driving circuit. The initialization voltage signal lines are configured to provide initialization voltage signals to the plurality of rows of pixel units respectively, and are arranged at intervals along a second direction. At least one initialization voltage signal line extends along a first direction. The plurality of rows of pixel units include a $(2n-1)^{th}$ row and a $2n^{th}$ row and pixel driving circuits of the $(2n-1)^{th}$ row and pixel driving circuits of the $2n^{th}$ rows share a common initialization voltage signal line.

19 Claims, 17 Drawing Sheets

(52) U.S. Cl.
CPC .............. *G09G 2300/0426* (2013.01); *G09G 2300/0452* (2013.01); *G09G 2300/0819* (2013.01); *G09G 2300/0852* (2013.01); *G09G 2310/08* (2013.01); *G09G 2320/0233* (2013.01)

(56) References Cited

U.S. PATENT DOCUMENTS

| | | |
|---|---|---|
| 8,400,577 B2 | 3/2013 | Asano et al. |
| 9,583,553 B2 | 2/2017 | Park et al. |
| 9,960,223 B2 | 5/2018 | Ebisuno et al. |
| 10,504,980 B2 | 12/2019 | Asano et al. |
| 2007/0195250 A1 | 8/2007 | Onogi et al. |
| 2008/0029768 A1 | 2/2008 | Asano et al. |
| 2012/0176421 A1 | 7/2012 | Asano et al. |
| 2012/0188212 A1 | 7/2012 | Ina et al. |
| 2013/0140575 A1 | 6/2013 | Asano et al. |
| 2015/0015468 A1* | 1/2015 | Ko ................. G09G 3/3233 345/82 |
| 2016/0240603 A1 | 8/2016 | Park et al. |
| 2016/0329394 A1 | 11/2016 | Asano et al. |
| 2017/0309696 A1 | 10/2017 | Ebisuno et al. |
| 2018/0308427 A1* | 10/2018 | Zhang ............. G09G 3/3233 |
| 2019/0189056 A1* | 6/2019 | Gai ................. G09G 3/3233 |
| 2021/0193775 A1 | 6/2021 | Kang et al. |
| 2021/0241684 A1 | 8/2021 | Ogawa et al. |
| 2022/0013701 A1 | 1/2022 | Ikeda et al. |

FOREIGN PATENT DOCUMENTS

| | | |
|---|---|---|
| CN | 204257651 U | 4/2015 |
| CN | 105895658 A | 8/2016 |
| CN | 107346777 A | 11/2017 |
| CN | 112673412 A | 4/2021 |
| CN | 113646825 A | 11/2021 |
| CN | 113724647 A | 11/2021 |
| JP | 2007256905 A | 10/2007 |

* cited by examiner

DISPLAY SUBSTRATE INCLUDING COMMON INITIALIZATION VOLTAGE SIGNAL LINE, DISPLAY PANEL, AND DISPLAY APPARATUS

CROSS-REFERENCE TO RELATED APPLICATION

This application is a Section 371 National Stage Application of International Application No. PCT/CN2022/117276, filed on Sep. 6, 2022, entitled "DISPLAY SUBSTRATE, DISPLAY PANEL, AND DISPLAY APPARATUS", the content of which is incorporated herein by reference in its entirety.

TECHNICAL FIELD

The present disclosure relates to a field of display technology, and in particular to a display substrate, a display panel, and a display apparatus.

BACKGROUND

OLED (Organic Light-Emitting Diode) is a current type organic light-emitting device, which emits light by using injection and recombination of carriers and has a luminous intensity proportional to the injected current. Under the action of an electric field, holes generated by an anode and electrons generated by a cathode in an OLED move and are respectively injected into a hole transmission layer and an electron transmission layer to move to a light-emitting layer. When a hole and an electron meet in the light-emitting layer, energy excitons are generated, thereby exciting light-emitting molecules and generating visible light.

For the above light-emitting device, due to an existence of a certain display brightness deviation, a compensation circuit is required to be designed so as to reduce the display deviation. After the addition of the compensation circuit design, a pixel driving portion becomes more complex, and more space is required for the design of a driving circuit inside pixels requires, which makes it hard to effectively achieve a display design having a high resolution.

SUMMARY

In order to solve at least one aspect of the above problems, according to embodiments of the present disclosure, a display substrate, a display panel and a display apparatus are provided.

In an aspect, there is provided a display substrate, including: a base substrate; a plurality of pixel units disposed on the base substrate, where the plurality of pixel units are arranged in an array along a first direction and a second direction, so as to form a plurality of rows of pixel units and a plurality of columns of pixel units, at least one of the pixel units includes a plurality of sub-pixels, and at least one of the sub-pixels includes a light-emitting element and a pixel driving circuit for driving the light-emitting element; and plurality of initialization voltage signal lines disposed on the base substrate, configured to provide initialization voltage signals to the plurality of rows of pixel units respectively, where the plurality of initialization voltage signal lines are arranged at intervals along the second direction, and at least one of the initialization voltage signal lines extends along the first direction. The plurality of rows of pixel units include a $(2n-1)^{th}$ row of pixel units and a $2n^{th}$ row of pixel units, n being a positive integer, and pixel driving circuits of the $(2n-1)^{th}$ row of pixel units and pixel driving circuits of the $2n^{th}$ row of pixel units share a common initialization voltage signal line.

In some exemplary embodiments of the present disclosure, the display substrate further includes a plurality of initialization voltage signal leads disposed on the base substrate, electrically connected with the initialization voltage signal lines. The plurality of initialization voltage signal leads are arranged at intervals along the first direction, and at least one of the initialization voltage signal leads extends along the second direction. The plurality of columns of pixel units include a $(2m-1)^{th}$ column of pixel units and a $2m^{th}$ column of pixel units, m being a positive integer, and pixel driving circuits of the $(2m-1)^{th}$ column of pixel units and pixel driving circuits of the $2m^{th}$ column of pixel units share a common initialization voltage signal lead.

In some exemplary embodiments of the present disclosure, the display substrate further includes a plurality of reference voltage signal leads disposed on the base substrate, configured to provide a reference voltage. The plurality of reference voltage signal leads are arranged at intervals along the first direction, and at least one of the reference voltage signal leads extends along the second direction. Pixel driving circuits of a $(2m-1)^{th}$ column of pixel units and pixel driving circuits of a $2m^{th}$ column of pixel units share a common reference voltage signal lead.

In some exemplary embodiments of the present disclosure, the display substrate further includes a plurality of first voltage signal leads disposed on the base substrate, configured to provide a first voltage to the light-emitting element. The plurality of first voltage signal leads are arranged at intervals along the first direction, and at least one of the first voltage signal leads extends along the second direction. The plurality of columns of pixel units further include a $(2m+1)^{th}$ column of pixel units, and the pixel driving circuits of the $2m^{th}$ column of pixel units and pixel driving circuits of the $(2m+1)^{th}$ column of pixel units share a common first voltage signal lead.

In some exemplary embodiments of the present disclosure, the display substrate further includes a plurality of first voltage signal lines disposed on the base substrate, electrically connected with the first voltage signal leads. The plurality of first voltage signal lines are arranged at intervals along the second direction, and at least one of the first voltage signal lines extends along the first direction. The plurality rows of pixel units further include a $(2n+1)^{th}$ row of pixel units, and the pixel driving circuits of the $2n^{th}$ row of pixel units and pixel driving circuits of the $(2n+1)^{th}$ row of pixel units share a common first voltage signal line.

In some exemplary embodiments of the present disclosure, the pixel driving circuits of the $(2n-1)^{th}$ row of pixel units and the pixel driving circuits of the $2n^{th}$ row of pixel units are symmetrical with respect to the common initialization voltage signal line.

In some exemplary embodiments of the present disclosure, the pixel driving circuits of the $2n^{th}$ row of pixel units and the pixel driving circuits of the $(2n+1)^{th}$ row of pixel units are symmetrical with respect to the common first voltage signal line.

In some exemplary embodiments of the present disclosure, pixel driving circuits of a column of sub-pixels close to the common first voltage signal lead in the $2m^{th}$ column of pixel units and pixel driving circuits of a column of sub-pixels close to the common first voltage signal lead in the $(2m+1)^{th}$ column of pixel units are symmetrical with respect to the common first voltage signal lead.

In some exemplary embodiments of the present disclosure, the display substrate further includes: a plurality of light emission control signal lines disposed on the base substrate, configured to provide light emission control signals to the plurality of rows of pixel units respectively, where the plurality of light emission control signal lines are arranged at intervals along the second direction, and at least one of the light emission control signal lines extends along the first direction; a plurality of first scanning signal lines disposed on the base substrate, configured to provide first scanning signals to the plurality of rows of pixel units respectively, where the plurality of first scanning signal lines are arranged at intervals along the second direction, and at least one of the first scanning signal lines extends along the first direction; a plurality of second scanning signal lines disposed on the base substrate, configured to provide second scanning signals to the plurality of rows of pixel units respectively, where the plurality of second scanning signal lines are arranged at intervals along the second direction, and at least one of the second scanning signal lines extends along the first direction; a plurality of reference voltage signal lines disposed on the base substrate, electrically connected with the reference voltage signal leads, where the plurality of reference voltage signal lines are arranged at intervals along the second direction, and at least one of the reference voltage signal lines extends along the first direction; and a plurality of third scanning signal lines disposed on the base substrate, configured to provide third scanning signals to the plurality of rows of pixel units respectively, where the plurality of third scanning signal lines are arranged at intervals along the second direction, and at least one of the third scanning signal lines extends along the first direction.

In some exemplary embodiments of the present disclosure, the light emission control signal line, the first scanning signal line, the second scanning signal line, the reference voltage signal line and the third scanning signal line of the $(2n-1)^{th}$ of pixel units are located on a side of the common initialization voltage signal line, and the first voltage signal line, the light emission control signal line, the first scanning signal line, the second scanning signal line, the reference voltage signal line and the third scanning signal line of the $2n^{th}$ row of pixel units are located on another side, which is opposite to the side in the second direction, of the common initialization voltage signal line.

In some exemplary embodiments of the present disclosure, the common initialization voltage signal line is spaced from the first voltage signal line, the light emission control signal line, the first scanning signal line, the second scanning signal line, the reference voltage signal line and the third scanning signal line of the (2n−1)th row of pixel units by gradually decreased distances in the second direction; and/or, the common initialization voltage signal line is spaced from the first voltage signal line, the light emission control signal line, the first scanning signal line, the second scanning signal line, the reference voltage signal line and the third scanning signal line of the $2n^{th}$ row of pixel units by gradually decreased distances in the second direction.

In some exemplary embodiments of the present disclosure, the plurality of sub-pixels include a first sub-pixel, a second sub-pixel, and a third sub-pixel. The display substrate further includes: a plurality of first data leads disposed on the base substrate, configured to provide first data signals to plurality of columns of the first sub-pixels respectively, where the plurality of first data leads are arranged at intervals along the first direction, and at least one of the first data leads extends along the second direction; a plurality of second data leads disposed on the base substrate, configured to provide second data signals to plurality of columns of the second sub-pixels respectively, where the plurality of second data leads are arranged at intervals along the first direction, and at least one of the second data leads extends along the second direction; and a plurality of third data leads disposed on the base substrate, configured to provide third data signals to plurality of columns of the third sub-pixels respectively, where the plurality of third data leads are arranged at intervals along the first direction, and at least one of the third data leads extends along the second direction.

In some exemplary embodiments of the present disclosure, for the $(2m-1)^{th}$ column of pixel units and the $2m^{th}$ column of pixel units, the first voltage signal lead, the first data lead, the second data lead and the third data lead of one column of pixel units is located on a side of the common initialization voltage signal lead away from the common reference voltage signal lead in the first direction, and the first voltage signal lead, the first data lead, the second data lead and the third data lead of the other column of pixel units are located on a side of the common reference voltage signal lead away from the common initialization voltage signal lead in the first direction.

In some exemplary embodiments of the present disclosure, the first voltage signal lead, the first data lead the second data lead and the third data lead of the (2m−1)th column of pixel units are located on a side of the common initialization voltage signal lead away from the common reference voltage signal lead, and the common initialization voltage signal lead is spaced from the first voltage signal lead, the first data lead, the second data lead and the third data lead of the $(2m-1)^{th}$ column of pixel units by gradually decreased distances in the first direction; and/or the first voltage signal lead, the first data lead, the second data lead and the third data lead of the $2m^{th}$ column of pixel units are located on a side of the common reference voltage signal lead away from the common initialization voltage signal lead, and the common reference voltage signal lead is spaced from the first data lead, the second data lead, the third data lead and the first voltage signal lead of the $2m^{th}$ column of pixel units by gradually increased distances in the first direction.

In some exemplary embodiments of the present disclosure, the first voltage signal lines, the reference voltage signal lines, and the initialization voltage signal lines are located in a first conductive layer. The light emission control signal lines, the first scanning signal lines, the second scanning signal lines and the third scanning signal lines are located in a second conductive layer, and the first conductive layer and the second conductive layer are different conductive layers disposed on the base substrate.

In some exemplary embodiments of the present disclosure, among the first voltage signal line, the light emission control signal line, the first scanning signal line, the second scanning signal line, the reference voltage signal line, the third scanning signal line, and the initialization voltage signal line of a same row of pixel units, in the second direction, a minimum spacing between orthographic projections of two adjacent signal lines in different conductive layers on the base substrate is less than a minimum spacing of orthographic projections of two adjacent signal lines in a same conductive layer on the base substrate.

In some exemplary embodiments of the present disclosure, the display substrate further includes a semiconductor layer and a third conductive layer on the base substrate. The first conductive layer, the semiconductor layer, the second conductive layer and the third conductive layer are disposed away from the base substrate sequentially. The display substrate further includes a light shielding portion, and the pixel driving circuit includes a driving transistor, where the driving transistor includes a channel region, and an orthographic projection of the light shielding portion on the base substrate covers an orthographic projection of the channel region on the base substrate. The light shielding portion is located in the first conductive layer.

In some exemplary embodiments of the present disclosure, the driving transistor further includes a gate electrode in the second conductive layer.

In some exemplary embodiments of the present disclosure, the pixel driving circuit further includes a storage capacitor, and the storage capacitor comprises a first capacitive electrode and a second capacitive electrode, where the first capacitive electrode includes a first electrode portion in the semiconductor layer, the second capacitive electrode includes a second electrode portion in the first conductive layer and a third electrode portion in the third conductive layer, and the second electrode portion are electrically connected with the third electrode portion. An orthographic projection of the first electrode portion on the base substrate at least partially overlaps with an orthographic projection of the second electrode portion on the base substrate, and the orthographic projection of the first electrode portion on the base substrate at least partially overlaps with an orthographic projection of the third electrode portion on the base substrate.

In some exemplary embodiments of the present disclosure, a gate electrode of the driving transistor is electrically connected with the first electrode portion through a first via hole; and/or the driving transistor further includes a source electrode and a drain electrode, one of the source electrode and the drain electrode of the driving transistor is electrically connected with the third electrode portion through a second via hole, the second electrode portion is electrically connected with the third electrode portion through a third via hole, and an orthographic projection of the second via hole on the base substrate at least partially overlap with an orthographic projection of the third via hole on the base substrate.

In some exemplary embodiments of the present disclosure, the display substrate further includes: a pixel defining layer on a side of the third conductive layer away from the base substrate, and a plurality of openings in the pixel defining layer. The plurality of sub-pixels include the plurality of openings respectively. For two adjacent rows of pixel units, orthographic projections of the openings of the sub-pixels of one row of pixel units on the base substrate at least partially overlap with an orthographic projection of the initialization voltage line for the row of pixel units on the base substrate, and orthographic projections of the openings of the sub-pixels of the other row of pixel units on the base substrate at least partially overlap with an orthographic projection of the first voltage signal line for the other row of pixel units on the base substrate.

In some exemplary embodiments of the present disclosure, the light-emitting element includes a first electrode electrically connected with one of the source electrode and the drain electrode of the driving transistor through an anode connecting hole; and an orthographic projection of the anode connecting hole on the base substrate is within the orthographic projection of the third electrode portion on the base substrate.

In some exemplary embodiments of the present disclosure, the pixel driving circuit further includes a first transistor, a second transistor, a third transistor and a fourth transistor, and each of the first transistor, the second transistor, the third transistor and the fourth transistor including a gate electrode, a source electrode and a drain electrode. One of the source electrode and the drain electrode of the first transistor is electrically connected with the gate electrode of the driving transistor. One of the source electrode and the drain electrode of the second transistor is electrically connected with the gate electrode of the driving transistor. One of the source electrode and the drain electrode of the third transistor is electrically connected with the second capacitive electrode. One of the source electrode and the drain electrode of the fourth transistor is electrically connected with the other of the source electrode and the drain electrode of the driving transistor.

In some exemplary embodiments of the present disclosure, the gate electrode of the first transistor is electrically connected with the first scanning signal line, and one of the first data lead, the second data lead and the third data lead is electrically connected with the other one of the source electrode and the drain electrode of the first transistor; and/or the gate electrode of the second transistor is electrically connected with the second scanning signal line, and the other one of the source electrode and the drain electrode of the second transistor is electrically connected with the reference voltage signal line; and/or the gate electrode of the third transistor is electrically connected with the third scanning signal line, and the other one of the source electrode and the drain electrode of the third transistor is electrically connected with the initialization voltage signal line; and/or the gate electrode of the fourth transistor is electrically connected with the light emission control signal line, and the other one of the source electrode and the drain electrode of the fourth transistor is electrically connected with the first voltage signal line.

In another aspect, there is provided a display panel, including the display substrate as described above.

In yet another aspect, there is provided a display apparatus, including the display substrate as described above or the display panel as described above.

BRIEF DESCRIPTION OF THE DRAWINGS

Other objectives and advantages of the present disclosure will be apparent from the description of the present disclosure with reference to the accompanying drawings in the following text, which may help to have a comprehensive understanding of the present disclosure.

FIG. 5 shows a partial top view of a first conductive layer included in the display substrate according to the embodiments of the present disclosure, FIG. 6 shows a partial top view of a semiconductor layer included in the display substrate according to the embodiments of the present disclosure, FIG. 7 shows a partial top view of a second conductive layer included in the display substrate according to the embodiments of the present disclosure, FIG. 8 shows a partial top view of via holes included in the display substrate according to the embodiments of the present disclosure, FIG. 9 shows a partial top view of a third conductive layer included in the display substrate according to the embodiments of the present disclosure, FIG. 10 shows a partial top view of a planarization layer included in the display substrate according to the embodiments of the present disclosure, FIG. 11 shows a partial top view of an anode layer included in the display substrate according to the embodiments of the present disclosure, FIG. 12 shows a partial top view of a color filter layer included in the display substrate according to the embodiments of the present disclosure, FIG. 13 shows a partial top view of a combination of layers, shown in FIG. 5 to FIG. 12, included in the display substrate according to the embodiments of the present disclosure, and FIG. 14 shows a partial top view of a combination of layers, shown in FIG. 5 to FIG. 10, included in the display substrate according to the embodiments of the present disclosure;

Figure 1:
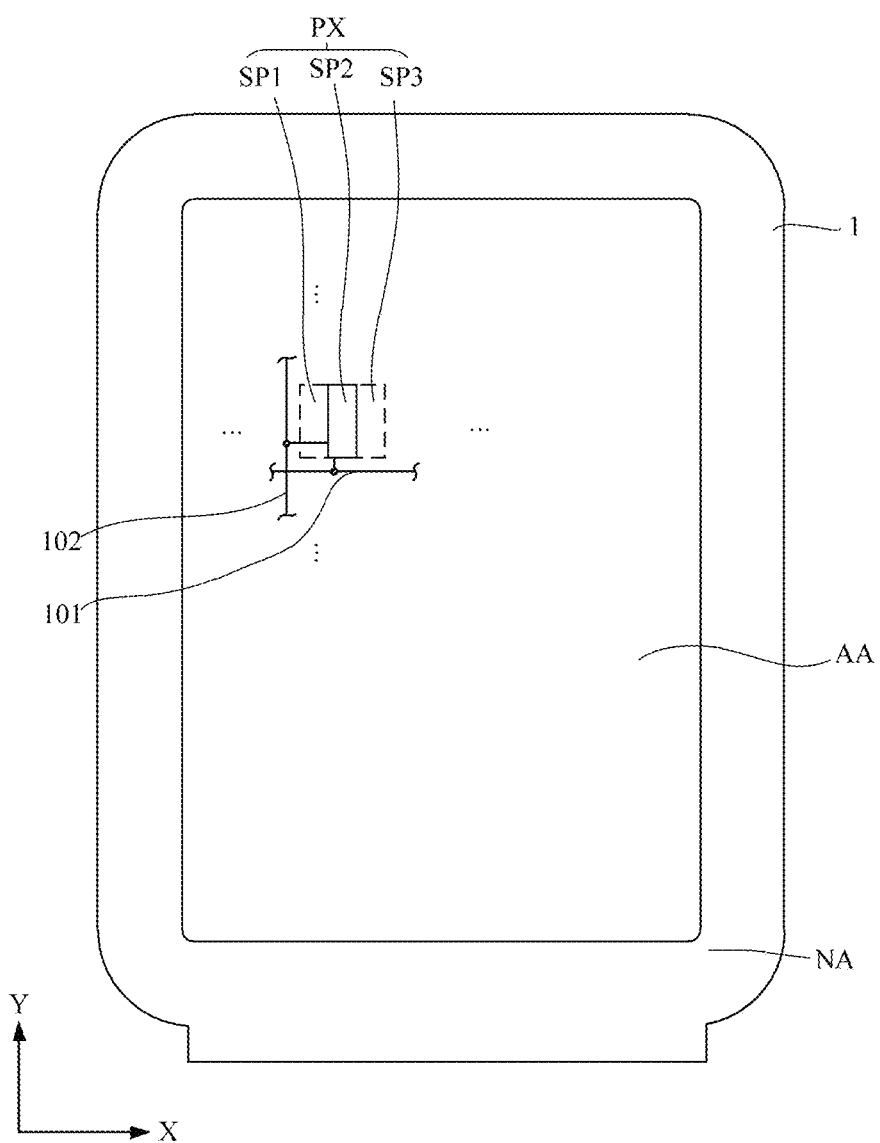
FIG. 1 shows a schematic top view of a display substrate according to the embodiments of the present disclosure.

It should be noted that, for the sake of clarity, the dimensions of layers, structures, or regions may be zoomed in or zoomed out in the drawings used to describe the embodiments of the present disclosure, i.e., the drawings are not drawn to actual scale.

DETAILED DESCRIPTION OF EMBODIMENTS

A further detailed description of the technical solution of the present disclosure will be made through the embodiments and in combination with the accompanying drawings. In the specification, the same or similar reference sign indicates the same or similar component. The following description of the embodiments of the present disclosure with reference to the accompanying drawings is intended to interpret a general inventive concept of the present disclosure, and should not be understood as a limitation to the present disclosure.

In addition, for ease of explanation, in the detailed description below, numerous specific details are set forth to provide a comprehensive understanding of the embodiments of the present disclosure. However, it is evident that one or more embodiments may also be implemented without these specific details.

It will be noted that terms such as "first" and "second" may be used here to describe various components, members, elements, regions, layers and/or portions, but these components, members, elements, regions, layers and/or portions should not be limited by these terms. Instead, these terms are used to distinguish one component, member, element, region, layer and/or portion from another. Therefore, for example, a first component, a first member, a first element, a first region, a first layer and/or a first portion discussed below may be referred to as a second component, a second member, a second element, a second region, a second layer and/or a second portion without departing from the teaching of the present disclosure.

For ease of description, spatial relation terms such as "up", "down", "left" and "right" may be used here to describe the relationship between one element or feature and another element or feature as shown in the figures. It will be understood that the spatial relation term is intended to cover other different orientations of a device in use or operation in addition to those described in the figures. For example, if the device in the figure is inverted, the element described as "below" or "under" another element or feature will be oriented as "above" or "over" another element or feature.

In the present text, the terms "basically", "about", "approximately", "substantially", and other similar terms are used as proximate terms rather than as degree terms, and they are intended to interpret an inherent deviation in a measured or calculated value that will be recognized by those skilled in the art. Taking into account process fluctuations, measurement problems, and errors associated with measurement of a specific quantity (i.e., limitations of a measurement system, the term "about" or "approximate" as used herein includes a stated value, and indicates that a specific value as determined by those skilled in the art is within an acceptable range of deviation. For example, "about" may indicate being within one or more standard deviations or within ±30%, ±20%, ±10%, ±5% of a stated value.

It will be noted that, herein, the expression "same layer" refers to a layer structure formed by using a same film forming process to form a layer for forming a specific pattern, and then using a same mask to pattern the layer through one patterning process. According to differences of specific patterns, one patterning process may include a plurality of exposure, development or etching processes, and the specific patterns in a formed layer structure may be continuous or discontinuous. That is, a plurality of elements, components, structures and/or portions in the "same layer" are made of the same material and are formed by using the same patterning process, and generally, the plurality of elements, components, structures and/or portions in the "same layer" have substantially the same thickness.

It will be understood by those skilled in the art that, unless otherwise stated herein, expressions of "continuous extension", "integrated structure", "overall structure" or similar expressions indicate that a plurality of elements, components, structures and/or portions are located in the same layer and are generally formed by the same patterning process during the manufacturing process, and there is no separation or fracture between these elements, components, structures and/or portions, and they are continuously extending structures.

Herein, directional expressions "first direction", "second direction" are used to describe different directions along a pixel region, such as a vertical direction and a horizontal direction of the pixel region. It will be understood that such expressions are only exemplary descriptions and are not limitations to the present disclosure.

Each of the transistors used in embodiments of the present disclosure may be a thin film transistor or field effect transistor or other devices having the same characteristics. As a source electrode and a drain electrode of a thin film transistor used herein are symmetric, the source and drain thereof may be interchanged. In the embodiments of the present disclosure, a transistor may include a gate electrode, a first electrode, and a second electrode, where the first electrode may represent one of the source electrode and the drain electrode, and the second electrode may represent the other one of the source electrode and the drain electrode. In the following examples, a case of a P-type thin film transistor used as a driving transistor is mainly described, other transistors may have a type the same as or different from the driving transistor according to the circuit design. Similarly, in other embodiments, the driving transistor may also be shown as an N-type thin film transistor.

Herein, the expression "PPI" (i.e. Pixels Per Inch) indicates a pixel density, which represents a quantity of pixels provided per inch. Generally, a higher PPI value indicates that a display apparatus may display an image in a higher density.

Herein, the term "common" may indicate a common use of a same signal line, power line, or the like. in a condition that an energized current or an energized voltage of a circuit is satisfied, for example, the common signal line, power line, or the like may be shared in a same position or in different positions.

Herein, the term "symmetric arrangement" may indicate that a certain signal line is taken as an axis of symmetry, and circuits on both sides has a symmetric structure with that signal line being taken as the axis of symmetry. Or, a certain point may be taken as a center of symmetry, and a circuit around the center of symmetry has a symmetric structure.

According to some exemplary embodiments of the present disclosure, there is provided a display substrate, including: a base substrate; a plurality of pixel units disposed on the base substrate, where the plurality of pixel units are arranged in an array along a first direction and a second direction, so as to form a plurality of rows of pixel units and a plurality of columns of pixel units, at least one of the pixel units includes a plurality of sub-pixels, and at least one of the sub-pixels includes a light-emitting element and a pixel driving circuit for driving the light-emitting element; and a plurality of initialization voltage signal lines disposed on the base substrate, where the plurality of initialization voltage signal lines respectively supply initialization voltage signals to the plurality of rows of pixel units, the plurality of initialization voltage signal lines are arranged at intervals along the second direction, and at least one of the initialization voltage signal lines extends along the first direction. The plurality of rows of pixel units include a $(2n-1)^{th}$ row of pixel units and a $2n^{th}$ row of pixel units, where n is a positive integer, and pixel driving circuits of the $(2n-1)^{th}$ row of pixel units and pixel driving circuits of the $2n^{th}$ row of pixel units share a common initialization voltage signal line.

For example, for the plurality of pixel units in the display substrate, adjacent pixel units of each row of pixel units share a common initialization voltage signal line. By using the layout manner provided in such embodiments, a region occupied by the initialization voltage signal lines in the display substrate may be reduced, so that the space utilization rate of the display substrate may be improved. This is beneficial to the achievement of a high PPI display apparatus and the improvement the display quality of a display apparatus.

FIG. 1 shows a schematic top view of a display substrate according to the embodiments of the present disclosure. Referring to FIG. 1, the display substrate according to the embodiments of the present disclosure may include a base substrate 1 and a pixel unit PX disposed on the base substrate 1.

The display substrate may include a display area AA and a non-display area NA. The display area AA may be an area provided with a pixel unit PX for displaying an image. Each pixel unit PX will be described later. The non-display area NA is an area provided with no pixel unit PX, i.e., it may be a region where no image is displayed. The non-display area NA corresponds to a frame in the final display apparatus, and a width of the frame may be determined according to a width of the non-display area NA.

The display area AA may have various shapes. For example, the display area AA may be provided in various shapes such as a polygon (e.g. a rectangle) of a closed shape including a straight edge, a circular shape or an elliptical shape including a curved edge, and a semicircle shape or a semi-elliptical shape including both a straight edge and a curved edge. In the embodiments of the present disclosure, the display area AA is provided as a region having a quadrilateral shape including a straight edge. It should be understood that this is only an exemplary embodiment of the present disclosure and is not a limit to the present disclosure.

The non-display area NA may be disposed on at least one side of the display area AA. In the embodiments of the present disclosure, the non-display area NA may surround a periphery of the display area AA. In the embodiments of the present disclosure, the non-display area NA may include a horizontal portion extending in a first direction X and a vertical portion extending in a second direction Y.

The pixel unit PX is disposed in the display area AA. The pixel unit PX is the smallest unit for displaying an image and a plurality of pixel units PX may be provided. For example, the pixel unit PX may include a light-emitting device emitting white light and/or a light-emitting device emitting color light.

The plurality of pixel units PX may be provided and arranged in a matrix formed with rows extending in the first direction X and columns extending in the second direction Y. However, the embodiments of the present disclosure do not specifically limit the arrangement of the pixel units PX, and the pixel units PX may be arranged in various forms. For example, the pixel units PX may be arranged so that a direction inclined with respect to the first direction X and the second direction Y serves as a column direction, and in a direction intersecting the column direction serves as a row direction.

That is, the plurality of pixel units PX are arranged in an array along the first direction X and the second direction Y to form a plurality of rows of pixel units and a plurality of columns of pixel units.

One pixel unit PX may include a plurality of sub-pixels. For example, one pixel unit PX may include three sub-pixels, i.e., a first sub-pixel SP1, a second sub-pixel SP2, and a third sub-pixel SP3. For example, the first sub-pixel SP1 may be a red sub-pixel, the second sub-pixel SP2 may be a green sub-pixel, and the third sub-pixel SP3 may be a blue sub-pixel.

It will be noted that, in the embodiments of the present disclosure, a quantity of sub-pixels included in one pixel unit is not particularly limited, and is not limited to the above three.

For example, in the exemplary embodiment shown in FIG. 1, a scanning signal line 101 and a data line 102 are schematically shown. That is, the display substrate may further include a plurality of scanning signal lines 101 and a plurality of data lines 102 disposed on the base substrate, where the plurality of scanning signal lines 101 respectively providing scanning signals to the plurality of rows of pixel units, and the plurality of data lines 102 respectively providing data signals to the plurality of columns of pixel units. The scanning signal line 101 extends along the first direction X, and the plurality of scanning signal lines 101 are arranged at intervals along the second direction Y. The data line 102 extends along the second direction Y, and the plurality of data lines 102 are arranged at intervals along the first direction X.

For example, the scanning signal line may be a representative of horizontal wires, and the data line may be a representative of vertical wires. It will be understood that the horizontal wires may further include wires of other types or wires for providing other signals, and the vertical wires may further include wires of other types or wires for providing other signals.

Each sub-pixel may include a light-emitting element and a pixel driving circuit for driving the light-emitting element. For example, in an OLED display substrate or display panel, a light-emitting element of a sub-pixel may include a stack of an anode, a light-emitting material layer and a cathode. Anodes of light-emitting elements of the respective sub-pixels are arranged at intervals and in a matrix formed with rows extending in the first direction X and columns extending in the second direction Y.

Herein, for the convenience of description, in each top view, an orthographic projection of an anode of a light-emitting element of a sub-pixel on the base substrate represents a corresponding sub-pixel.

Figure 2:
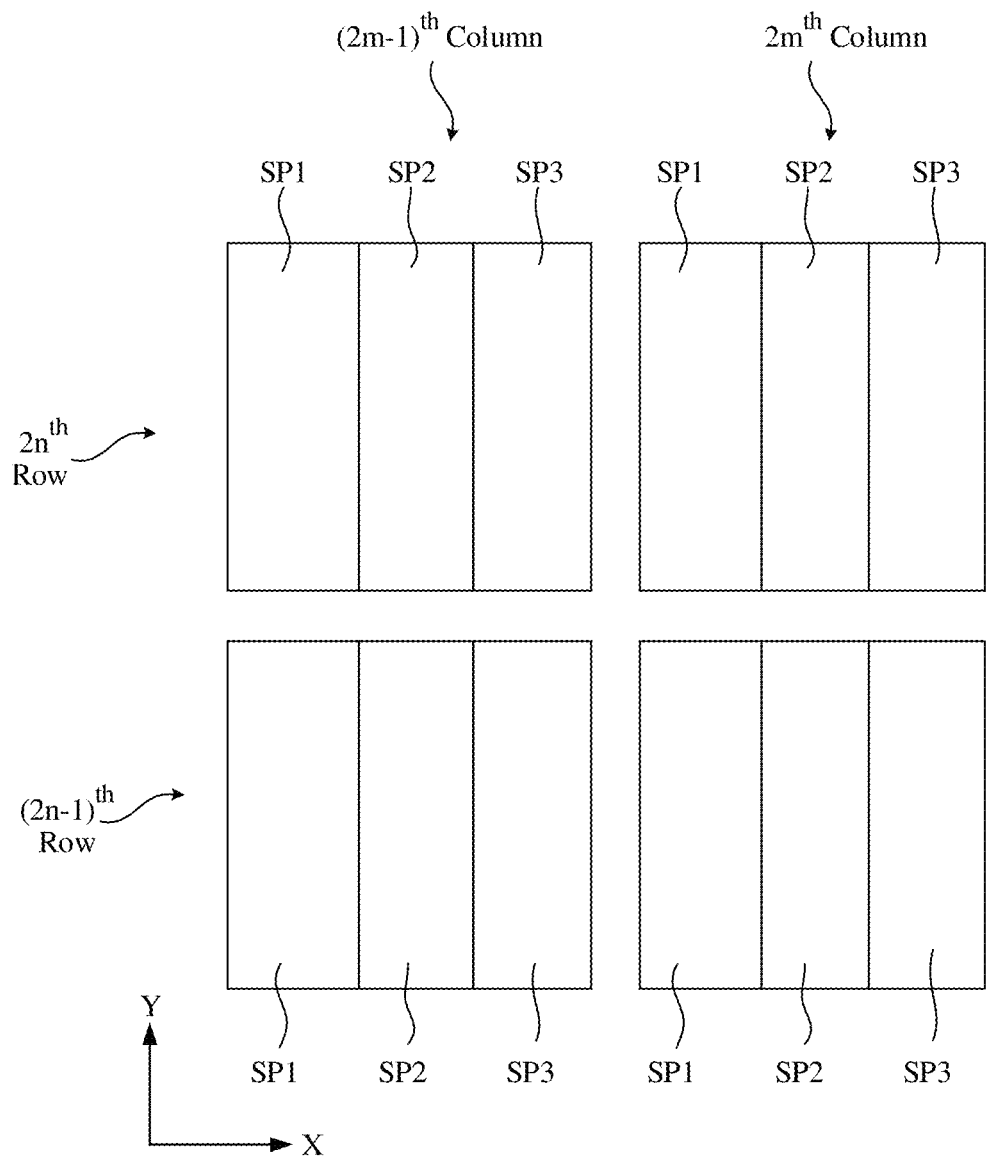
FIG. 2 shows a schematic top view of a plurality of sub-pixels of a display substrate according to the embodiments of the present disclosure.
Figure 3:
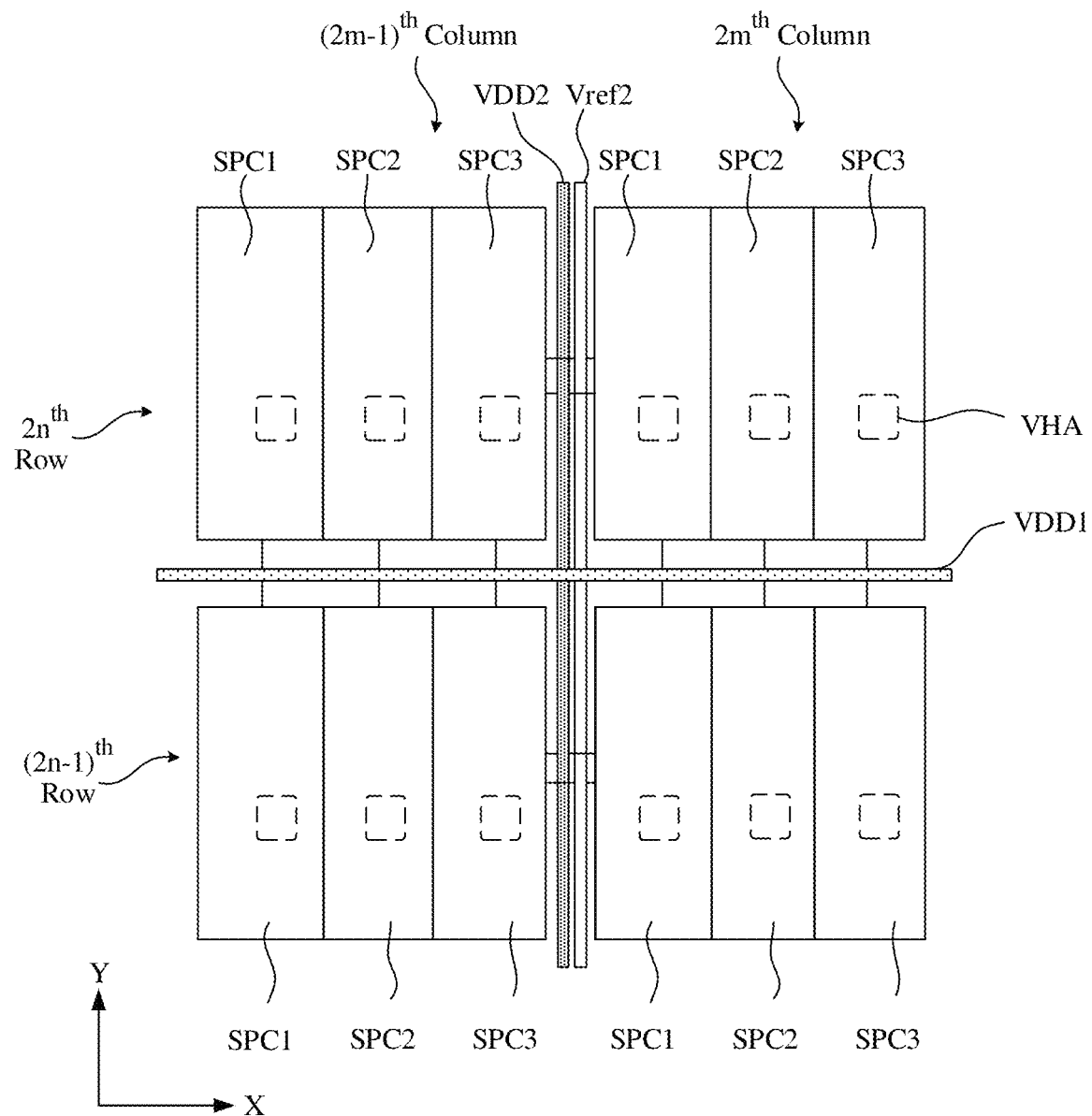
FIG. 3 shows a schematic top view of a pixel driving circuit of a plurality of sub-pixels of a display substrate according to the embodiments of the present disclosure.

FIG. 2 shows a schematic top view of a plurality of sub-pixels of the display substrate according to the embodiments of the present disclosure, and FIG. 3 is a schematic top view of pixel driving circuits of a plurality of sub-pixels of the display substrate according to the embodiments of the present disclosure.

Referring to FIG. 2 and FIG. 3, the display substrate may have a plurality of rows of pixel units, such as a (2n−1)th row of pixel units and a 2n$^{th}$ row of pixel units, each pixel unit has a plurality of sub-pixels, such as sub-pixels SP1, SP2, and SP3, and the plurality of sub-pixels SP1, SP2, and SP3 in a same row are arranged parallel along the first direction X, i.e., they are arranged horizontally and parallel to each other.

The first sub-pixel SP1 may include a first light-emitting element in a first light-emitting region and a first pixel driving circuit SPC1 for driving the first light-emitting element, and the first light-emitting element may emit red light. The second sub-pixel SP2 may include a second light-emitting element in a second light-emitting region and a second pixel driving circuit SPC2 for driving the second light-emitting element, and the second light-emitting element may emit green light. The third sub-pixel SP3 may include a third light-emitting element in a third light-emitting region and a third pixel driving circuit SPC3 for driving the third light-emitting element, and the third light-emitting element may emit blue light.

It will be noted that the light-emitting region of the sub-pixel may be a region where the light-emitting element of the sub-pixel is located. For example, the light-emitting region of the sub-pixel may be a region corresponding to the anode of the light-emitting element of the sub-pixel, or the light-emitting region of the sub-pixel may be a region corresponding to the light-emitting material layer portion that is sandwiched between the anode and the cathode.

In the embodiments of the present disclosure, each of orthographic projections of the pixel driving circuits of a plurality of sub-pixels on the base substrate at least partially overlap with an orthographic projection of a light-emitting element of a same sub-pixel on the base substrate. For example, referring to FIG. 2 and FIG. 3, the orthographic projections of the pixel driving circuits SPC1 of the plurality of sub-pixels on the base substrate at least partially overlap with the orthographic projection of the light-emitting element of a same sub-pixel SP1 on the base substrate respectively. In an optional embodiment, different pixel driving circuits may also, for example, at least partially overlap with the orthographic projection of the light-emitting element of a same sub-pixel on the base substrate.

For example, in the embodiments of the present disclosure, the pixel driving circuits SPC1, SPC2 and SPC3 of the plurality of sub-pixels SP1, SP2 and SP3 respectively correspond to the respective sub-pixels. That is, the pixel driving circuit SPC1 of the sub-pixel SP1 at least partially overlaps with the orthographic projection of the sub-pixel SP1 on the base substrate. The same applies to the sub-pixel SP2 and the sub-pixel SP3.

It will be noted that, in the illustrated embodiment, the orthographic projection of the pixel driving circuit of one sub-pixel on the base substrate at least partially overlaps with the orthographic projection of the light-emitting element of the same sub-pixel on the base substrate, i.e., the pixel driving circuit of one sub-pixel corresponds to the light-emitting element of one sub-pixel. However, the embodiments of the present disclosure are not limited to this. In other embodiments, the pixel driving circuits of two or more sub-pixels may be provided to correspond to the light-emitting element of one sub-pixel. For example, the pixel driving circuits of three sub-pixels correspond to the light-emitting element of one sub-pixel, and the pixel driving circuits of four sub-pixels correspond to the light-emitting element of one sub-pixel.

In FIG. 3, an anode connecting hole VHA is schematically shown with a dashed box. The anode of the light-emitting element of each sub-pixel may be electrically connected to the pixel driving circuit below through the anode connecting hole VHA, so that the pixel driving circuits of the respective sub-pixel may drive their respective light-emitting elements.

In the embodiments of the present disclosure, the respective sub-pixels are arranged in an unchanged manner, i.e., they are still arranged horizontally and parallel to each other. The pixel driving circuits of the sub-pixels in the same row are arranged at positions corresponding to the sub-pixels in the same row. The light-emitting element of each sub-pixel may still be electrically connected with the pixel driving circuit below through the anode connecting hole VHA, so that the pixel driving circuits of the respective sub-pixels may still drive their respective light-emitting elements.

For example, in FIG. 2, each rectangular box may schematically illustrate a profile of the orthographic projection of the anode of the light-emitting element of each sub-pixel on the base substrate. In FIG. 3, each solid rectangular box may schematically illustrate a profile of the orthographic projection of the pixel driving circuit of each sub-pixel on the base substrate.

It will be noted that in FIG. 1 to FIG. 3, rectangular boxes are used to illustrate the respective sub-pixels and the pixel driving circuits of the sub-pixels, but it will be understood that the rectangular boxes only schematically illustrate the layout of the sub-pixels and the pixel driving circuits of the sub-pixels, and the shape of the rectangular boxes does not limit the shape of the sub-pixels and the pixel driving circuits of the sub-pixels.

In this embodiment, for the same sub-pixel, the orthographic projection of the pixel driving circuit of the sub-pixel on the base substrate and the orthographic projection of the anode of the light-emitting element of the sub-pixel on the base substrate have the following relationship: the orthographic projection of the pixel driving circuit of the sub-pixel on the base substrate is located at the orthographic projection of the anode of the light-emitting element of the sub-pixel on the base substrate.

In other optional embodiments, the orthographic projection of the pixel driving circuit of the sub-pixel on the base substrate exceeds the orthographic projection of the anode of the light-emitting element of the sub-pixel on the base substrate in the first direction X; and/or the orthographic projection of the anode of the light-emitting element of the sub-pixel on the base substrate exceeds the orthographic projection of the pixel driving circuit of the sub-pixel on the base substrate in the second direction Y.

In the embodiments of the present disclosure, as shown in FIG. 3, each row has a plurality of pixel units, the sub-pixels of each pixel unit are arranged along the first direction X, and the display substrate has a plurality of rows of pixel units. For example, the display substrate includes a $(2n-1)^{th}$ row of pixel units and a $2n^{th}$ row of pixel units. The pixel driving circuits of the $(2n-1)^{th}$ row of pixel units and pixel driving circuits of the adjacent $2n^{th}$ row of pixel units share a common initialization voltage signal line Vini1.

In the embodiments of the present disclosure, each column also has a plurality of pixel units, and the display substrate has a plurality of columns of pixel units. For example, the display substrate includes a $(2m-1)^{th}$ column of pixel units and a $2m^{th}$ column of pixel units. The pixel driving circuits of the $(2m-1)^{th}$ column of pixel units and the pixel driving circuits of the adjacent $2m^{th}$ column of pixel units share a common initialization voltage signal lead Vini2. The initialization voltage signal line Vini1 and the initialization voltage signal lead Vini2 are electrically connected. The pixel driving circuits of the $(2m-1)^{th}$ column of pixel units and the pixel driving circuits of the adjacent $2m^{th}$ column of pixel units share a common reference voltage signal lead Vref2.

Figure 4A:
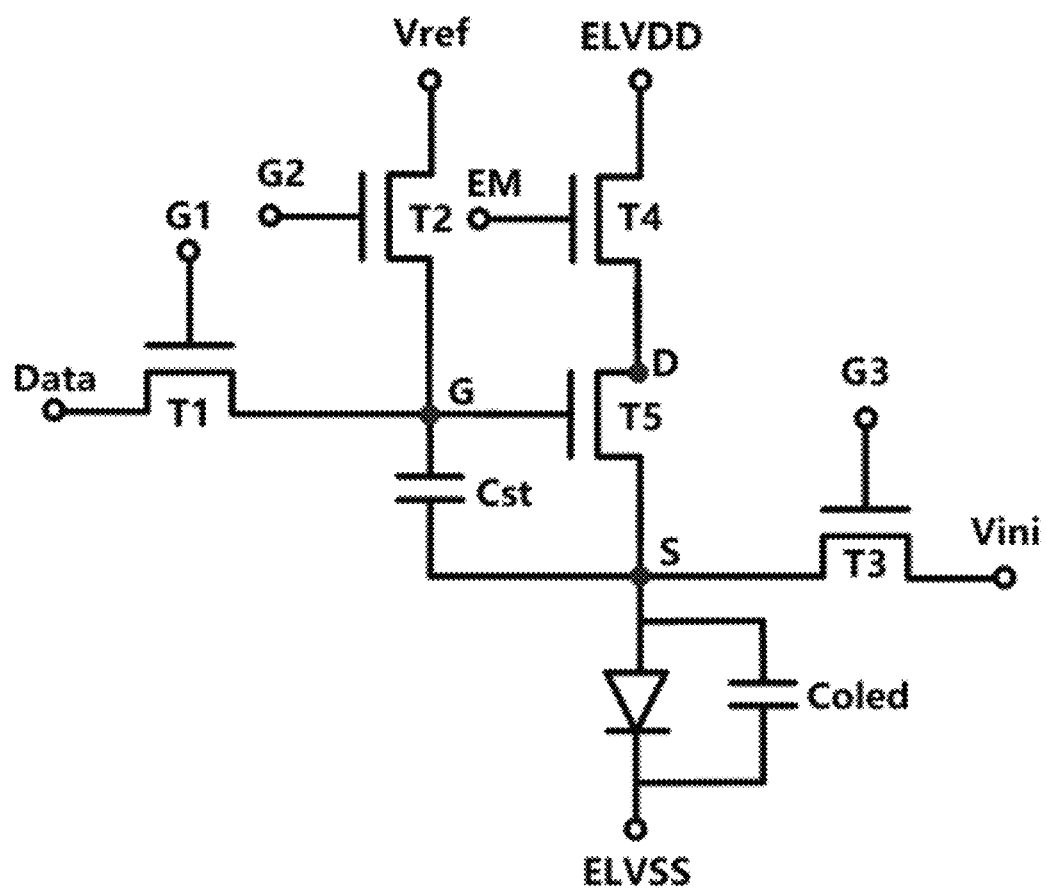
FIG. 4A shows a schematic diagram of a pixel driving circuit of a display substrate according to some exemplary embodiments of the present disclosure.

FIG. 4A shows a schematic diagram of a pixel driving circuit of a display substrate according to some exemplary embodiments of the present disclosure. The pixel driving circuit shown in FIG. 4A may be any one of the above-mentioned pixel driving circuits SPC1, SPC2, and SPC3. Referring to FIG. 4A, the pixel driving circuit may include a first transistor T1, a second transistor T2, a third transistor T3, a fourth transistor T4, a fifth transistor T5, a first storage capacitor C, and a second storage capacitor C'. This pixel driving circuit may be referred to as a 5T2C structure.

It will be noted that the 5T2C structure is taken as an example here to introduce the pixel driving circuit included in the display substrate according to the embodiments of the present disclosure, but the pixel driving circuit included in the display substrate according to the embodiments of the present disclosure is not limited to the 5T2C structure.

With continuous reference to FIG. 4A, a gate electrode of the first transistor T1 is electrically connected to a first scanning signal line G1 to receive a first scanning signal. A first electrode (e.g., a source electrode S1) of the first transistor T1 is electrically connected to a data lead DR, DG or DB to receive a data signal. A second electrode (e.g., a drain electrode D1) of the first transistor T1 is electrically connected to a node G.

A gate electrode of the second transistor T2 is electrically connected to a second scanning signal line G2 to receive a second scanning signal. A first electrode (e.g., a source electrode S2) of the second transistor T2 is electrically connected to a reference voltage signal line Vref1. A second electrode (e.g., a drain electrode D2) of the second transistor T2 is electrically connected to the node G.

A gate electrode of the third transistor T3 is electrically connected to a third scanning signal line G3. A first electrode (e.g., a source electrode S3) of the third transistor T3 is electrically connected to the initialization voltage signal line Vini1 to receive the initialization voltage signal. A second electrode (e.g., a drain electrode D3) of the third transistor T3 is electrically connected to a node S.

A gate electrode of the fourth transistor T4 is electrically connected to a light emission control signal line EM to receive a light emission control signal. A first electrode (e.g., a source electrode S4) of the fourth transistor T4 is electrically connected to a second electrode (e.g., a drain electrode D5) of the fifth transistor, and a second electrode (e.g., a drain electrode D4) of the fourth transistor is electrically connected to a first voltage signal line VDD1.

A gate electrode of the fifth transistor T5 (also referred to as a driving transistor) is electrically connected to the node G. A first electrode (e.g., a source electrode S5) of the fifth transistor T5 is electrically connected to the node S. A second electrode (e.g., a drain electrode D5) of the fifth transistor T5 is electrically connected to the first electrode (e.g., a source electrode S4) of the fourth transistor.

Figure 4B:
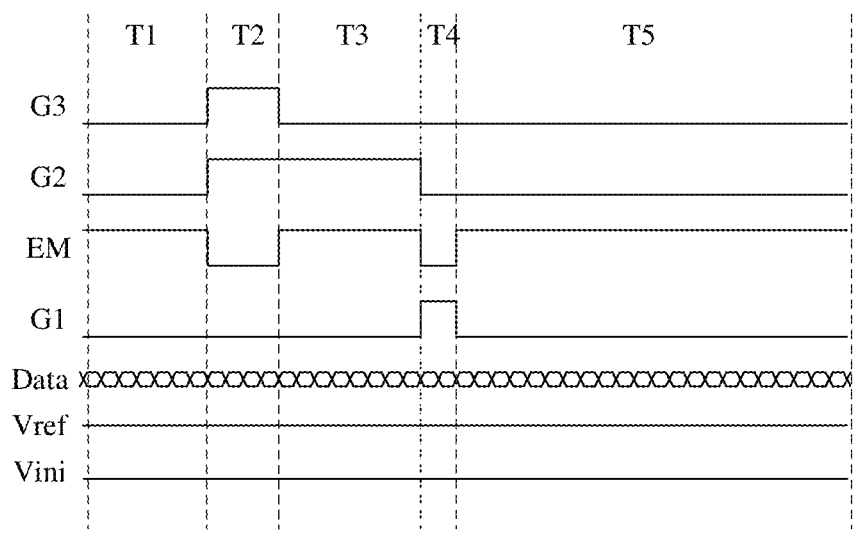
FIG. 4B shows a diagram of a part of timings for a pixel driving circuit of a display substrate according to some exemplary embodiments of the present disclosure.

FIG. 4B shows a diagram of a part of timings for a pixel driving circuit of a display substrate according to some exemplary embodiments of the present disclosure. The operating principle of the pixel driving circuit provided in the embodiments of the present disclosure will be further explained with reference to FIG. 4A and FIG. 4B.

In a first reset stage T1, EM is a high-voltage turned-on signal, and G1, G2 and G3 are all low-voltage turned-off signals; the transistor T4 controlled through EM is turned on, and the transistor T1 controlled through G1, the transistor T2 controller through G2 and the transistor T3 controlled through G3 are all turned off. The first voltage (e.g., a VDD voltage) is written into the drain electrode of the driving transistor T5.

In a second reset stage T2, EM and G1 are low-voltage turned-off signals, and G2 and G3 are high-voltage turned-on signals; the transistor T1 controlled through G1 and the transistor T4 controlled through EM are both turned off, and the transistor T2 controlled through G2 and the transistor T3 controlled through G3 are both turned on. The anode of the light-emitting element (e.g., a light-emitting diode OLED) is electrically connected to the source electrode of the driving transistor T5. The initialization voltage Vini is written into the source electrode of the driving transistor T5 and the anode of the light-emitting element, and the potential at the anode of the light-emitting element is reset to be Vini. Meanwhile, an optimal potential difference between Vini and a cathode voltage VSS of the light-emitting element is less than a turned-on threshold voltage of the light-emitting element, so as to ensure that the light-emitting element does not emit light at this time, thereby improving the brightness quality of the display in a dark state and the contrast. A reference voltage Vref is written into the gate electrode of the driving transistor T5. A potential difference between the reference voltage Vref and the VDD voltage is Vgs of the driving transistor T5, so as to ensure that a large current flows through the driving transistor T5, thereby eliminating or reducing a characteristic drift of the driving transistor T5 caused by a stress under a small current when the display panel transits from a long-time low-brightness display using the small current to a high-brightness display using a large current. As such, a brightness trailing phenomenon when changing from displaying a black picture to displaying a white picture may be eliminated or weakened. According to different situations of Vref and Vini voltages, the large current of the driving transistor T5 in this stage permits the driving transistor T5 to work in an amplification region and a saturation region. In theory, the best state is that the driving transistor T5 works in the saturation region, which may maximize the current flowing through the MDT. Also, in the second reset stage T2, the potentials at both terminals of the storage capacitor Cst are reset, so that the writing of a current frame signal is not affected by a previous frame signal.

In a compensation stage T3, EM and G2 are both high-voltage turned-on signals, and G1 and G3 are both low-voltage turned-off signals; the transistor T1 controlled through G1 and the transistor T3 controlled through G3 are both turned off, and the transistor T2 controlled through G2 and the transistor T4 controlled through EM are turned on. In this process, the voltage at the node S is gradually charged to reach the difference between the reference voltage and the transistor threshold voltage Vth until the transistor T5 is turned off, and the compensation process ends. At this time, for the driving transistor T5, there is Vgs−Vth=0. As Vg=Vref, Vs=Vg−Vth=Vref−Vth. In this way, the potential difference between the two terminals of the storage capacitor Cst is the threshold voltage Vth of the driving transistor T5.

In a data writing stage T4, G1 is a high-voltage turned-on signal and G2, G3 and EM are all low-voltage turned-off signals; the transistor T1 controlled through G1 is turned on, and the transistor T2 controlled through G2, the transistor T3 controlled through G3 and the transistor T4 controlled through EM are all turned off. The data signal Vdata is written into the gate electrode of the driving transistor T5. As one terminal of the storage capacitor Cst is electrically connected to the gate electrode of the driving transistor T5, the data voltage Vdata will be stored at the node G, i.e. the voltage of the storage capacitor Cst at the node G is Vdata.

In a light-emitting stage T5, G1, G2 and G3 are all low-voltage turned-off signals, and EM is a high-voltage turned-on signal; the transistor T1 controlled through G1, the transistor T2 controlled through G2 and the transistor T3 controlled through G3 are all turned off, and the transistor T4 controlled through EM is turned on. The voltage difference Vsg between the source electrode and the gate electrode of the driving transistor T5 may be calculated with the following formula: Vsg=Vdata−V. As such, a current Id flowing through the driving transistor T5 (i.e. the current flowing through the OLED) may be calculated with Id=k(Vdata−V) 2, where k is a constant coefficient, which is related to the mobility, aspect ratio and gate-source capacitance value of the driving transistor T5. In this way, only the data voltage Vdata and the reference voltage Vref determine a magnitude of Id, and since Vref is a direct current voltage signal, only the data voltage Vdata determines the magnitude of Id. Therefore, in the embodiments of the present disclosure, the circuit structure in the specific embodiment of the pixel driving circuit as shown in FIG. 4A may realize the compensation of both the threshold voltage difference of the driving transistor and the IR Drop on the first voltage signal line VDD1.

Figure 5:
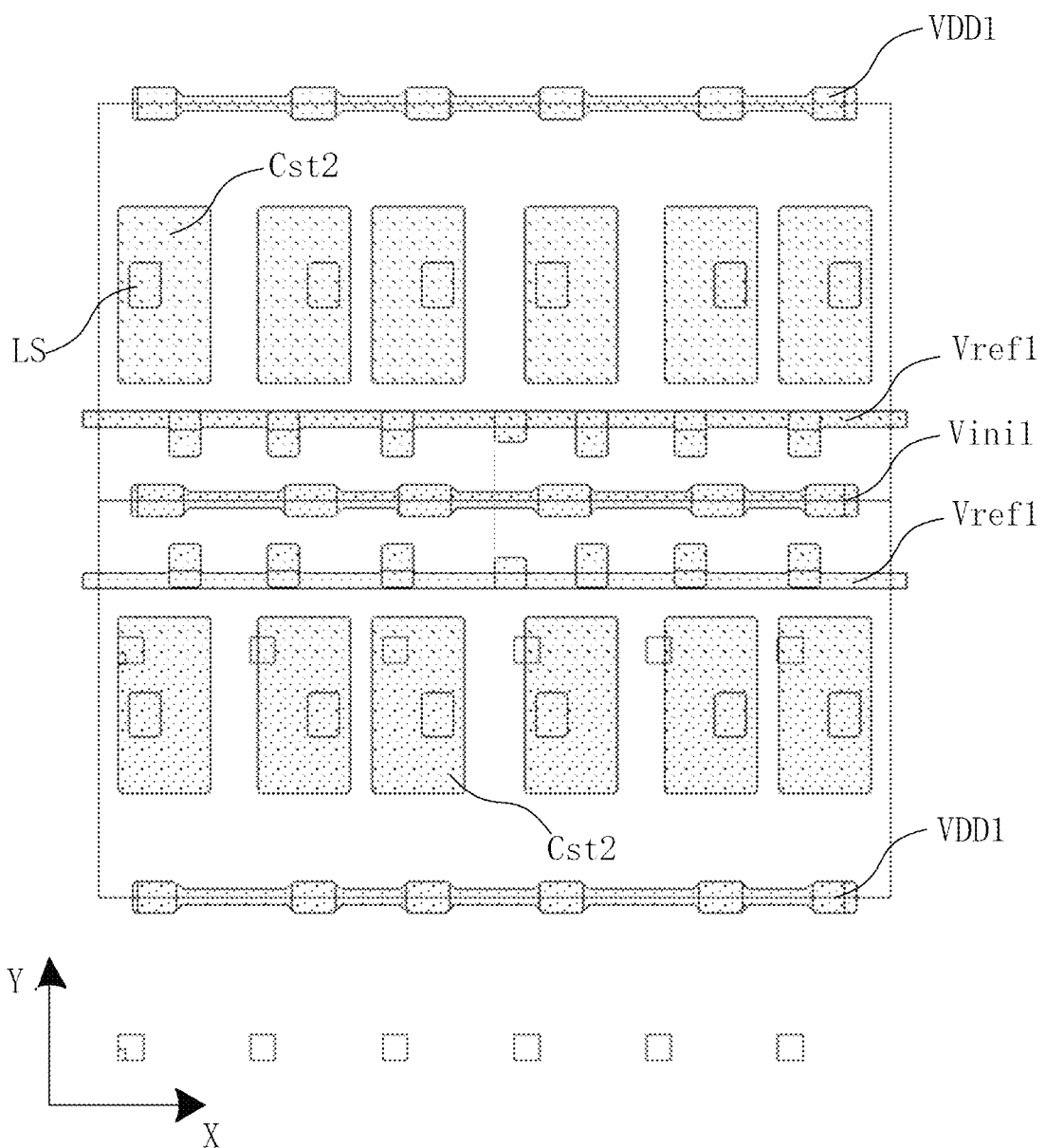
FIG. 5 to FIG. 14 are partial top views of the display substrate according to the embodiments of the present disclosure, schematically showing top views of pixel driving circuits of several of sub-pixels included in the display substrate, where
Figure 6:
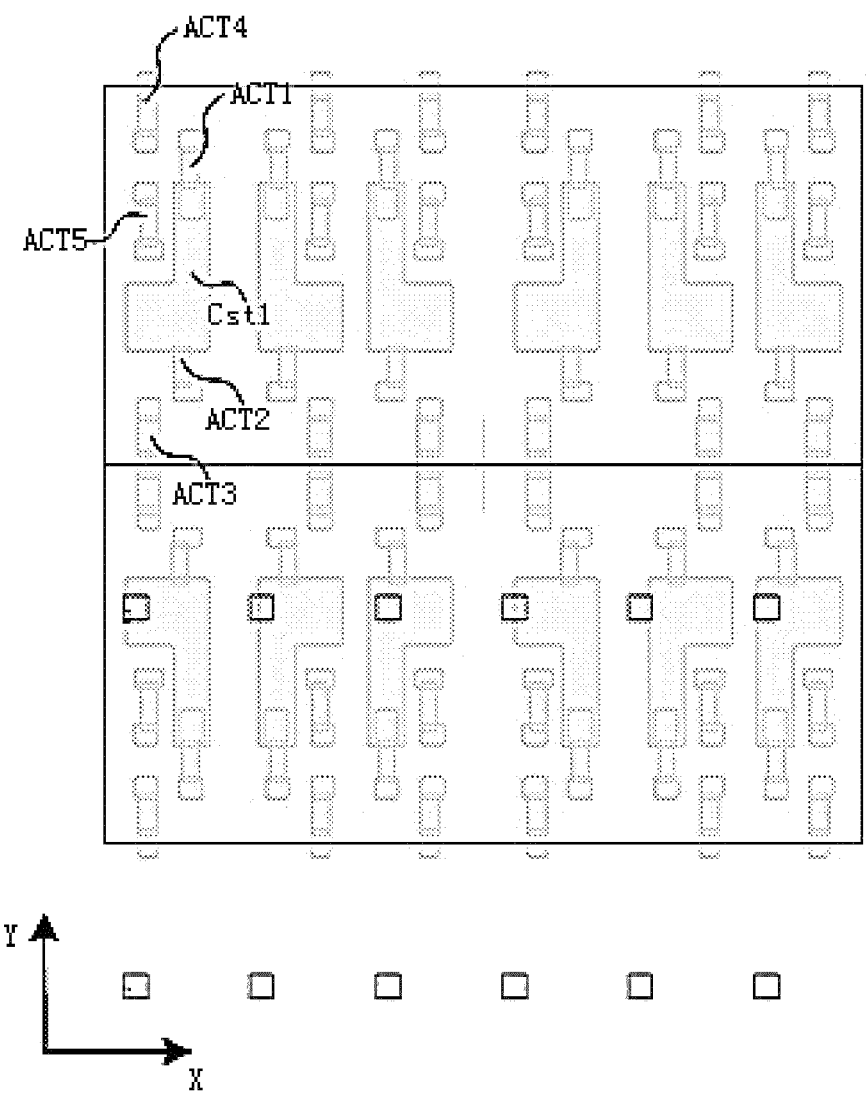
Figure 7:
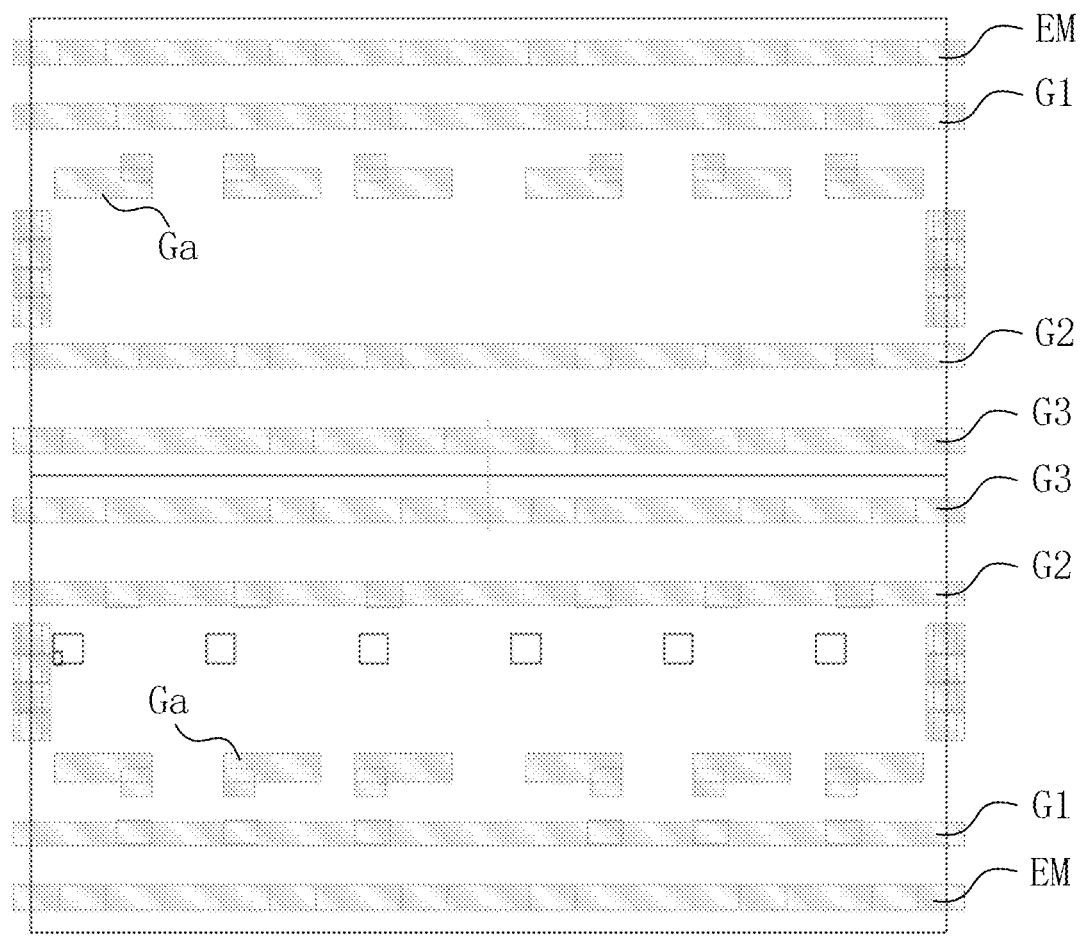
Figure 7:
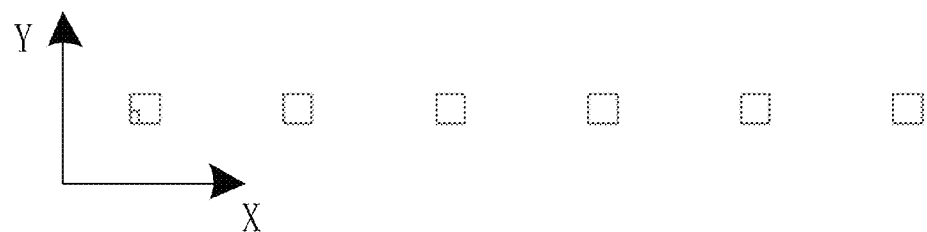
Figure 8:
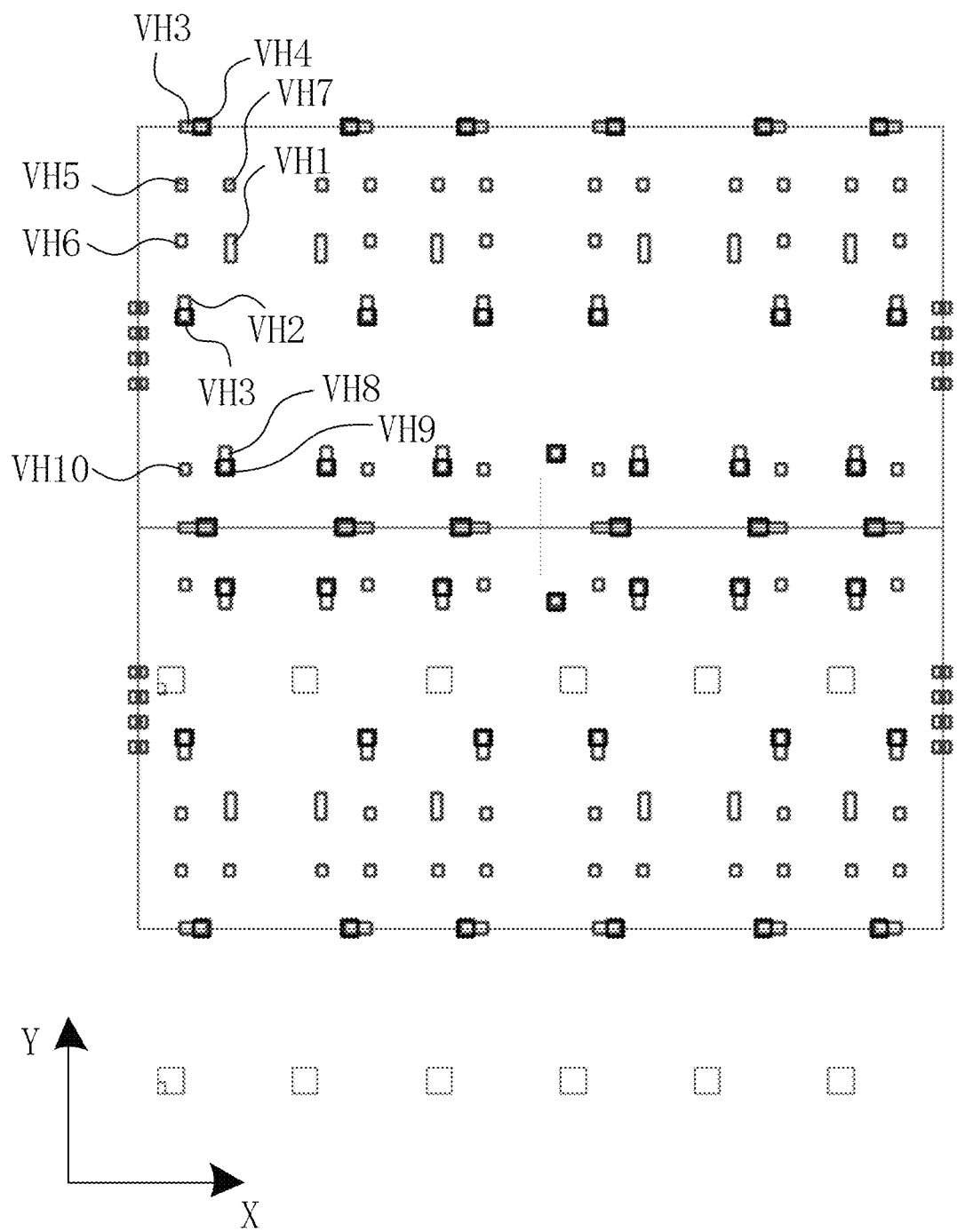
Figure 9:
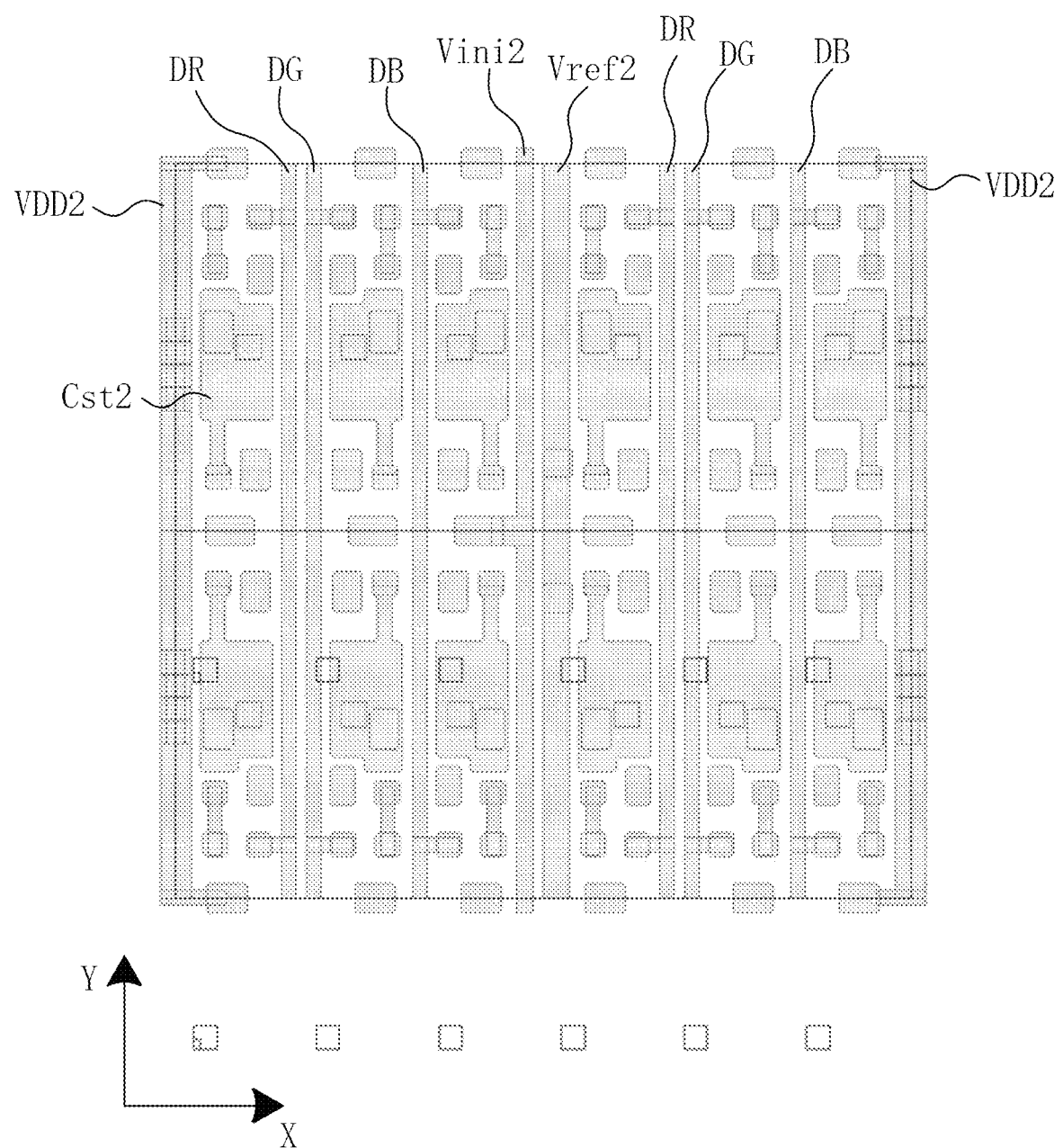
Figure 10:
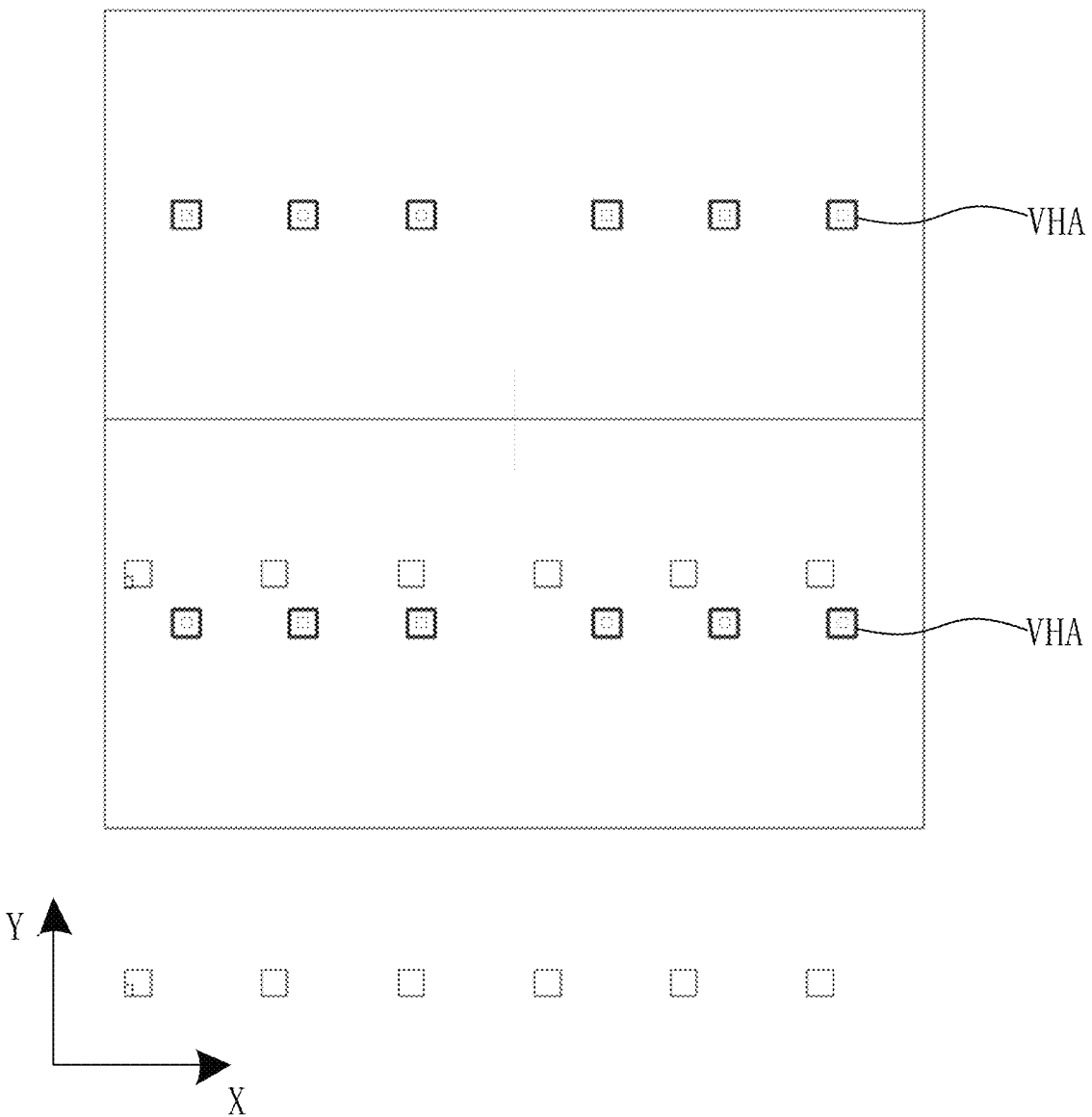
Figure 11:
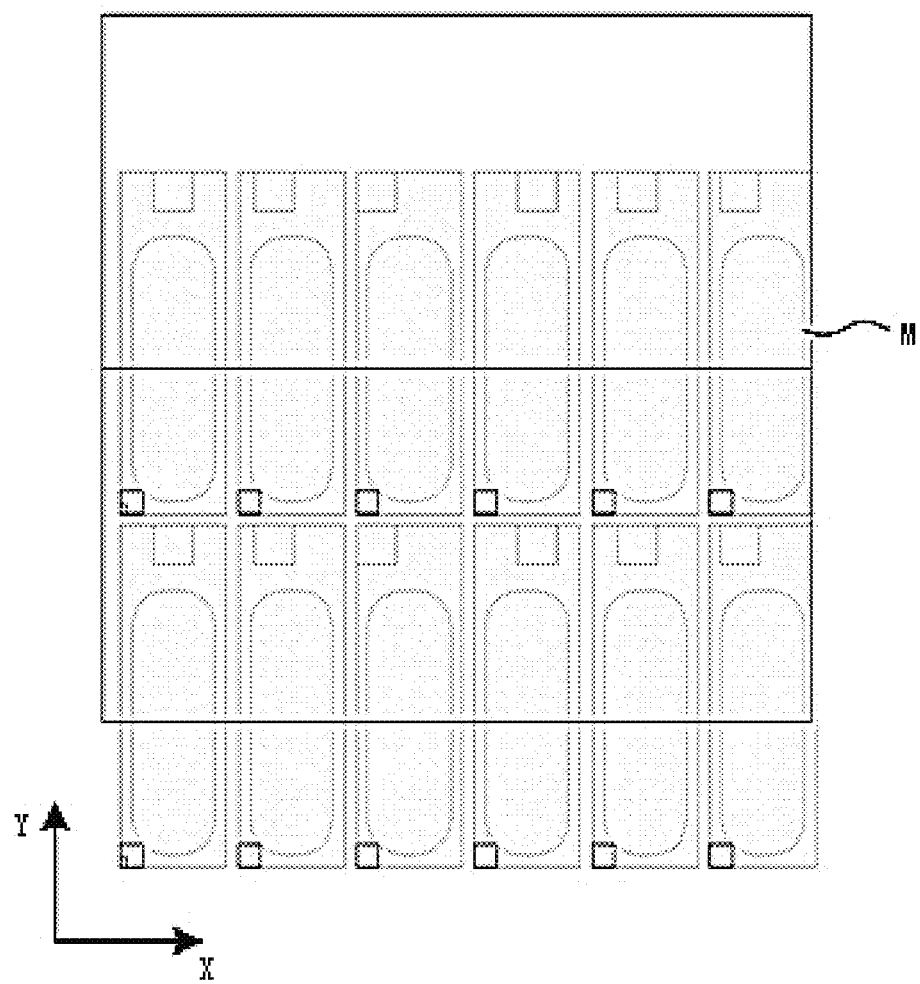
Figure 12:
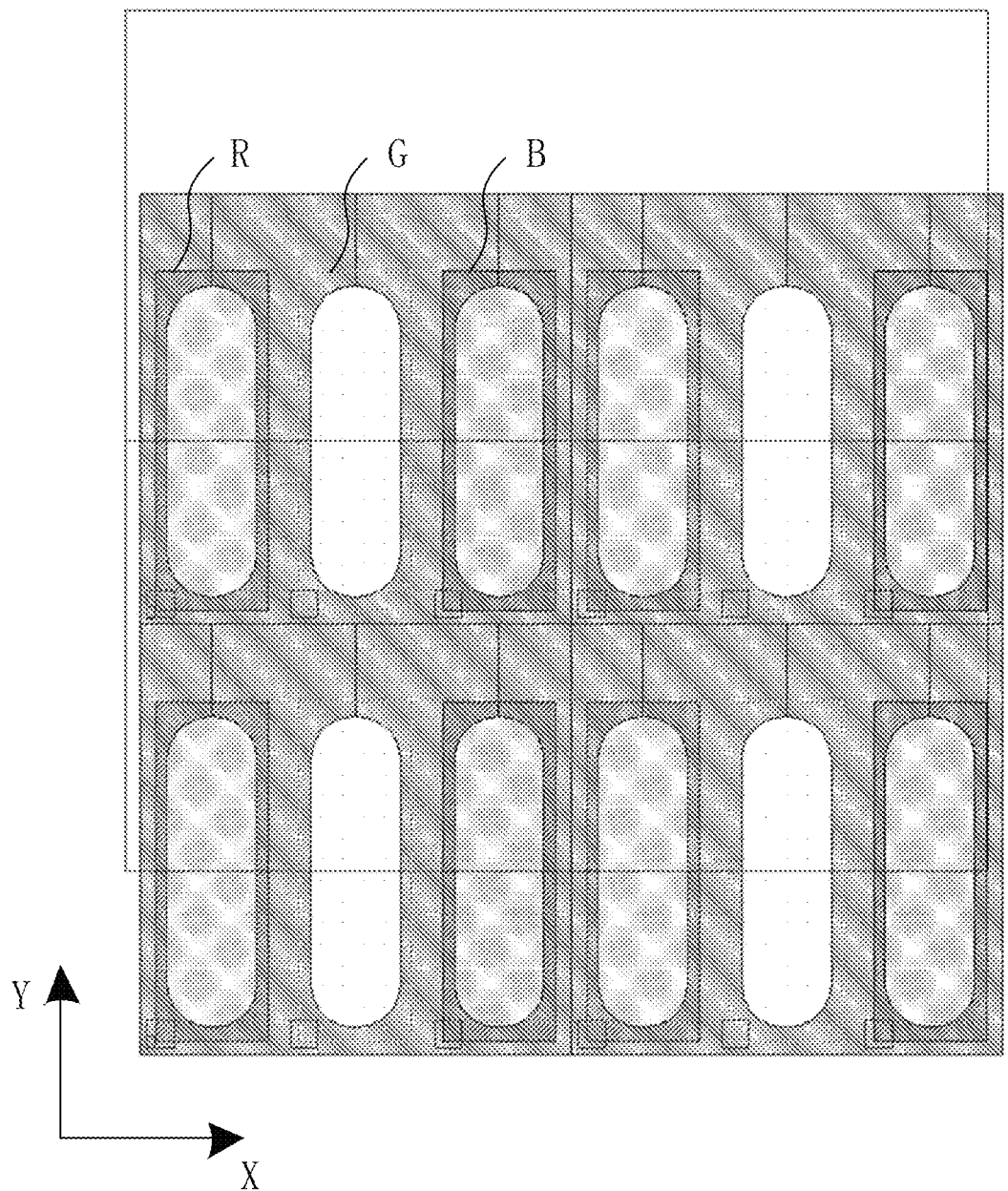
Figure 13:
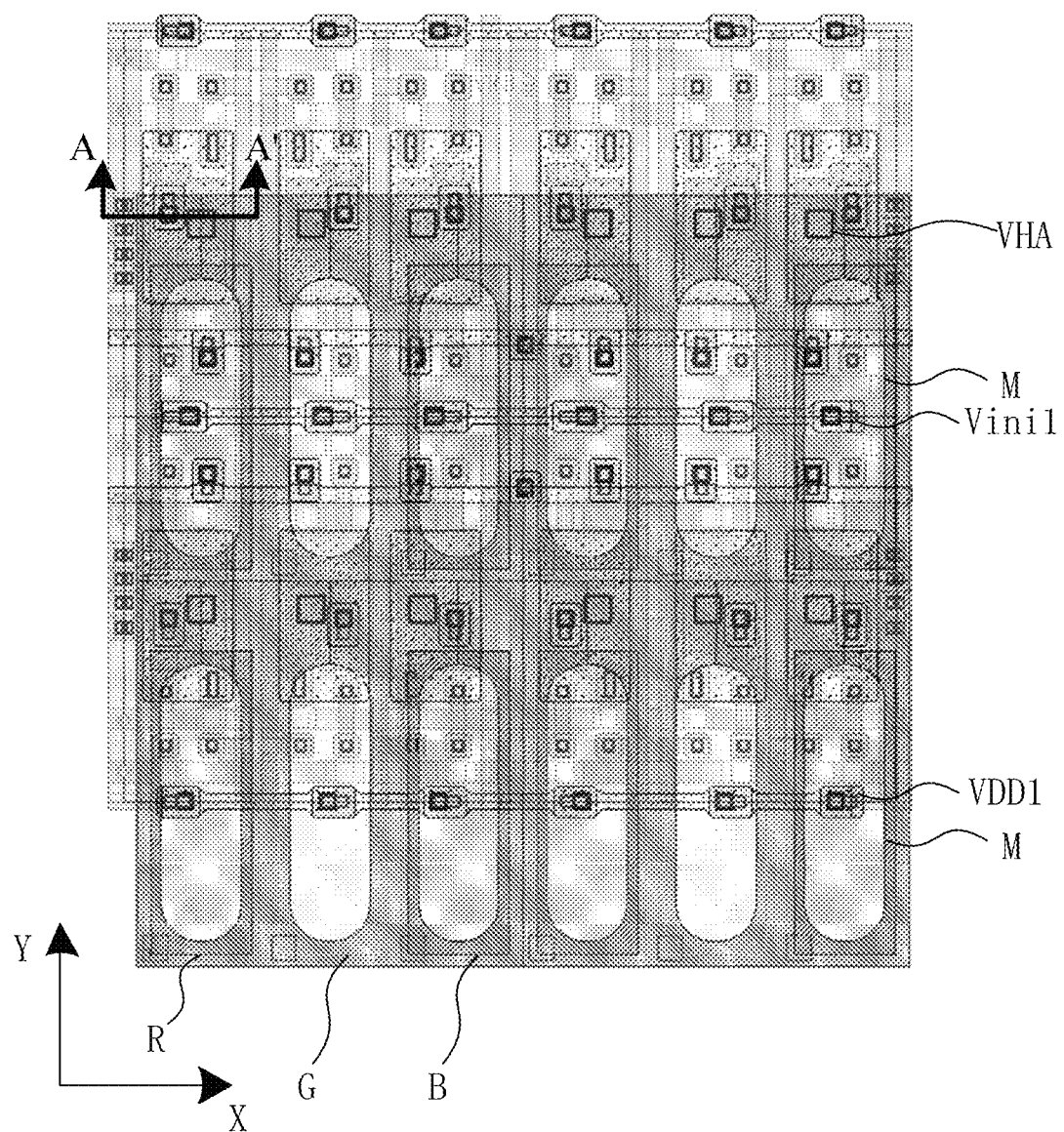
Figure 14:
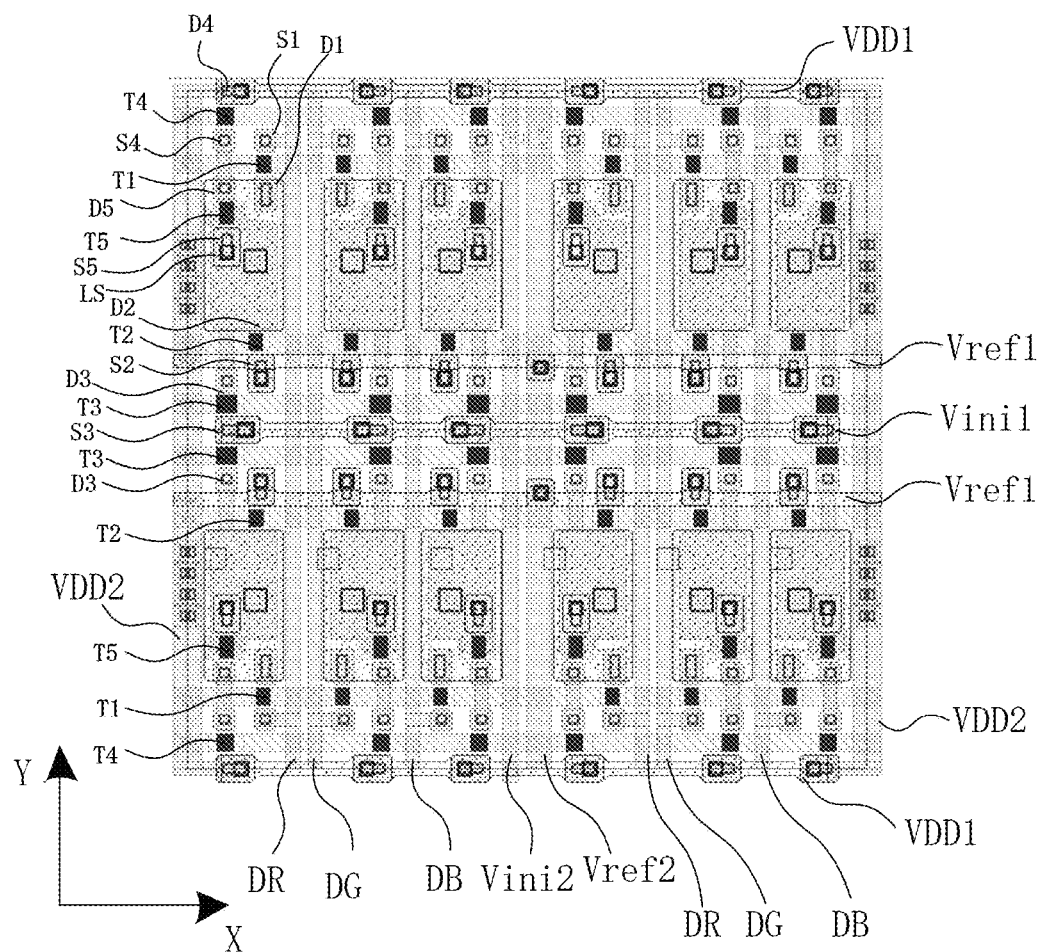
Figure 15:
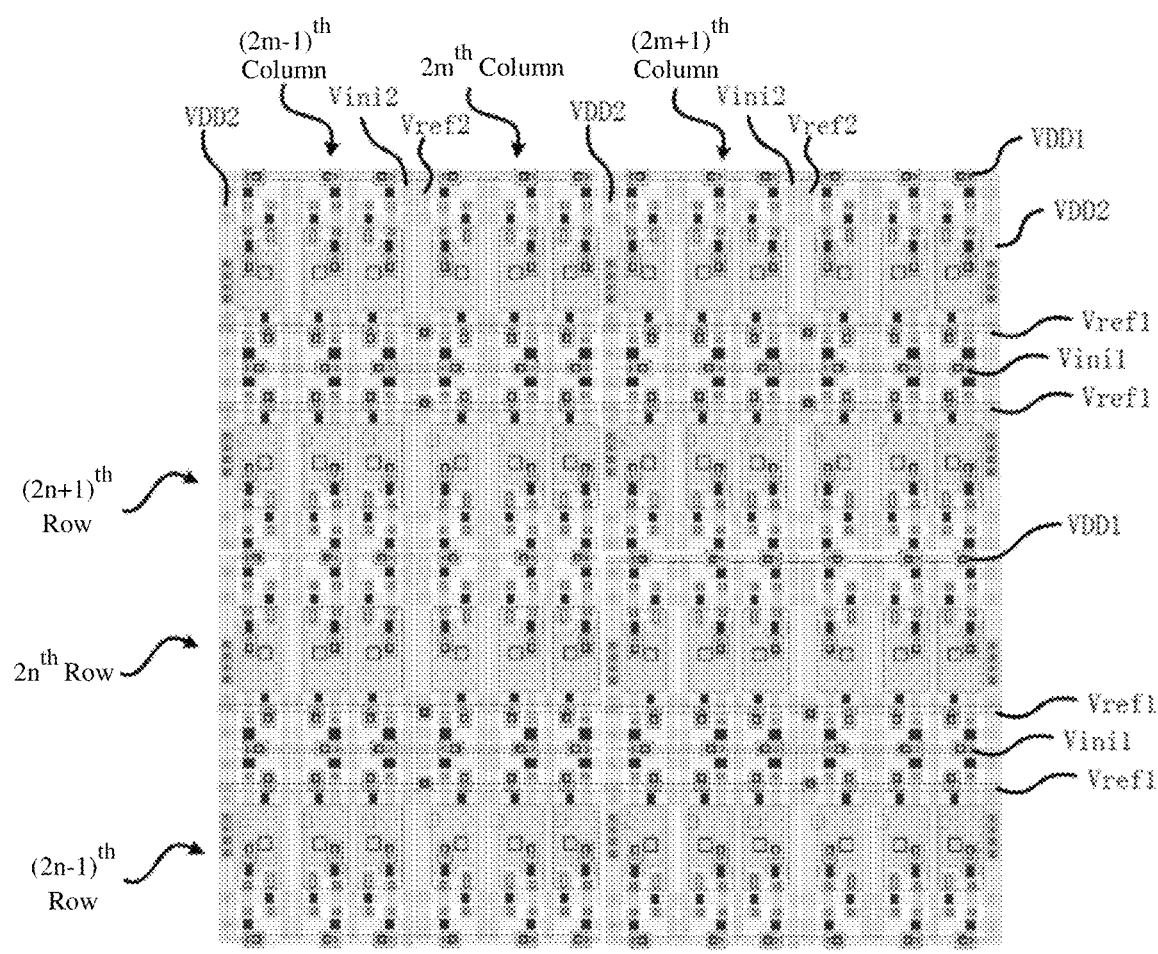
FIG. 15 shows a partial top view of a display substrate including more pixel units, according to the embodiments of the present disclosure.
Figure 16:
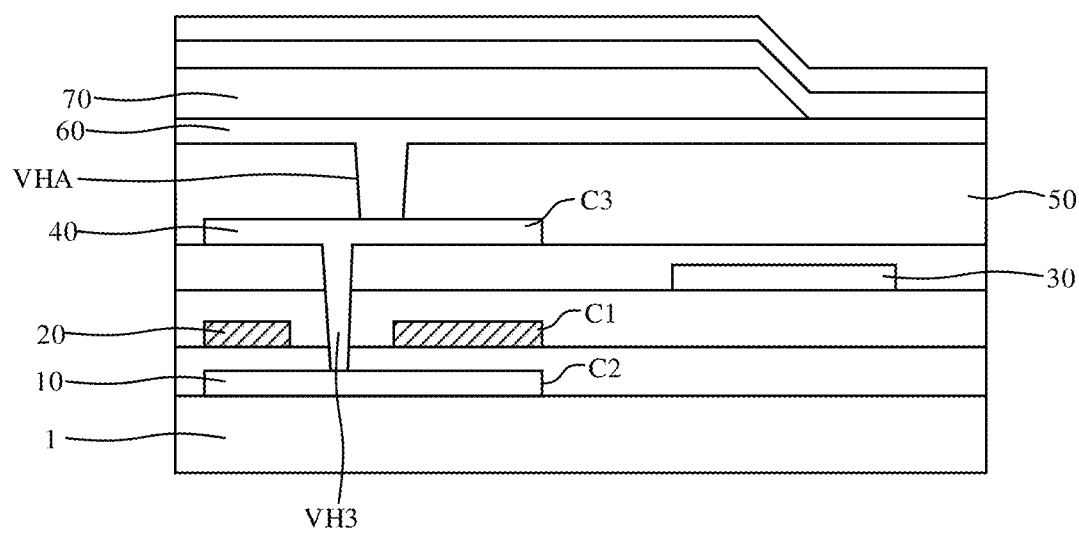
FIG. 16 shows a sectional view of the display substrate, which is taken along line AA in FIG. 13, according to the embodiments of the present disclosure.

FIG. 5 to FIG. 14 show partial top views of a display substrate according to the embodiments of the present disclosure, where top views of pixel driving circuits of several sub-pixels included in the display substrate are schematically showed. FIG. 5 shows a partial top view of a first conductive layer included in the display substrate according to the embodiments of the present disclosure. FIG. 6 shows a partial top view of a semiconductor layer included in the display substrate according to the embodiments of the present disclosure. FIG. 7 shows a partial top view of a second conductive layer included in the display substrate according to the embodiments of the present disclosure. FIG. 8 shows a partial top view of via holes included in the display substrate according to the embodiments of the present disclosure. FIG. 9 shows a partial top view of a third conductive layer included in the display substrate according to the embodiments of the present disclosure. FIG. 10 shows a partial top view of a planarization layer included in the display substrate according to the embodiments of the present disclosure. FIG. 11 shows a partial top view of an anode layer included in the display substrate according to the embodiments of the present disclosure. FIG. 12 shows a partial top view of a color filter layer included in the display substrate according to the embodiments of the present disclosure. FIG. 13 shows a partial top view of a combination of layers, shown in FIG. 5 to FIG. 12, included in the display substrate according to the embodiments of the present disclosure. FIG. 14 shows a partial top view of a combination of layers included in the display substrate, which are shown in FIG. 5 to FIG. 10, according to the embodiments of the present disclosure. FIG. 15 shows a partial top view of a display substrate including more pixel units, according to the embodiments of the present disclosure. FIG. 16 shows a sectional view of the display substrate, which is taken along line AA' in FIG. 13, according to the embodiments of the present disclosure.

Referring to FIG. 5 to FIG. 16, the display substrate may include at least one semiconductor layer, a plurality of conductive layers, and a plurality of insulating layers. For example, at least one insulating layer may be disposed between a semiconductor layer and an adjacent conductive layer, and may also be disposed between adjacent conductive layers.

As shown in FIG. 5 to FIG. 16, a first conductive layer 10 is first formed on the base substrate, a semiconductor layer 20 is formed on a side of the first conductive layer 10 away from the base substrate, a second conductive layer 30 is formed on a side of the semiconductor layer 20 away from the base substrate, a third conductive layer 40 is formed on a side of the second conductive layer 30 away from the base substrate, and layers such as a flattening layer 50, an anode layer 60 and a color filter layer 70 are sequentially formed on a side of the third conductive layer 40 away from the base substrate. In the embodiments of the present disclosure, one or more insulating layers may be provided between the conductive layers.

For example, the semiconductor layer may include materials such as amorphous silicon, polycrystalline silicon, or oxide semiconductor, and may include, for example, a channel region, a source region, and a drain region. The channel region may not be doped or have a doping type different from that of the source region and the drain region and therefore has semiconductor characteristics. The source region and the drain region are respectively located on both sides of the channel region, and are doped with impurities and therefore are conductive. The impurities may vary depending on whether the TFT is an N-type transistor or a P-type transistor. For example, in the embodiments of the present disclosure, each transistor may be an N-type thin film transistor.

In the embodiments of the present disclosure, as shown in FIG. 5 to FIG. 14, a plurality of pixel units are provided on a side of the base substrate of the display substrate, and the plurality of pixel units are arranged in an array along the first direction X and the second direction Y, so as to form a plurality of rows of pixel units and a plurality of columns of pixel units. At least one pixel unit includes a plurality of sub-pixels, and at least one sub-pixel includes a light-emitting element and a pixel driving circuit for driving the light-emitting element. A plurality of initialization voltage signal lines Vini1 are disposed on the base substrate and used to respectively supply initialization voltage signals to the plurality of rows of pixel units. The plurality of initialization voltage signal lines Vini1 are arranged at intervals along the second direction Y, that is, there are a plurality of initial voltage signal lines Vini1 along the second direction Y. which are spaced apart from each other by a certain distance. At least one initial voltage signal line Vini1 extends in the first direction X, that is, the initial voltage signal line Vini1 extends horizontally in the first direction X. Each row of pixel units has an odd row of pixel units and an even row of pixel units where the odd row of pixel units and the even row of pixel units share a common initialization voltage signal line Vini1.

For example, as shown in FIG. 5 and FIG. 15, the $(2n-1)^{th}$ row (e.g., the first row) of pixel units on the lower side of the initial voltage signal line Vini1 and the $2n^{th}$ row (e.g., the second row) of pixel units on the upper side of the initial voltage signal line Vini1 share a common initial voltage signal line Vini1 in the middle. Other rows of pixel units, such as the third row of pixel units and the fourth row of pixel units, share one common initial voltage signal line Vini1. The rest may be done in the same manner. In this way, the sharing of the common initialization voltage signal line between the pixel driving circuits of adjacent rows of pixel units may be realized, so that the area occupied by the initial voltage signal lines may be effectively reduced, thereby simplifying the design of the pixel driving circuit. Also, the area occupied by the pixel driving circuit or the pixel unit may be reduced, thereby meeting the high resolution requirement of the display substrate.

As shown in FIG. 9, the display substrate further includes a plurality of initialization voltage signal leads Vini2 disposed on the base substrate, and the initialization voltage signal leads Vini2 are electrically connected to the initialization voltage signal line Vini1, for example, through a via hole. The plurality of initialization voltage signal leads Vini2 are arranged at intervals along the first direction X, and at least one initialization voltage signal lead Vini2 extends along the second direction, that is, the initialization voltage signal lead Vini2 extends in the direction Y.

The pixel driving circuits of an odd column of pixel units and the pixel driving circuits of an even column of pixel units share a common initialization voltage signal lead Vini2. For example, the pixel driving circuits of the first column of pixel units and the pixel driving circuits of the second column of pixel units share a common initialization voltage signal lead Vini2, the pixel driving circuits of the third column of pixel units and the pixel driving circuits of the fourth column of pixel units share a common initialization voltage signal lead Vini2, and so on.

According to the embodiments of the present disclosure, the pixel driving circuits of adjacent pixel units in a column of pixels share a common initialization voltage signal lead Vini2, so that the area occupied by the initial voltage signal lines may be effectively reduced. On the basis of the use of the initialization voltage signal line Vini1 described above, the design of the pixel driving circuit may be further simplified, so that the area occupied by the pixel driving circuit or the pixel unit may be greatly reduced, thereby meeting the high resolution requirement of the display substrate.

As shown in FIG. 9, the display substrate further includes a plurality of reference voltage signal leads Vref2 disposed on the base substrate, and the reference voltage signal leads Vref2 are used for providing a reference voltage. The plurality of reference voltage signal leads Vref2 are arranged at intervals along the first direction, and at least one reference voltage signal lead Vref2 extends along the second direction. As shown in FIG. 9, the reference voltage signal lead Vref2 extends in the direction Y. The pixel driving circuits of an odd column of pixel units and the pixel driving circuits of an even column of pixel units share a common reference voltage signal lead Vref2.

As shown in FIG. 5, the display substrate further includes a plurality of first voltage signal leads VDD2 disposed on the base substrate, and the first voltage signal leads VDD2 are used for providing a first voltage to the light-emitting elements. The plurality of first voltage signal leads VDD2 are arranged at intervals along the first direction, and at least one first voltage signal lead VDD2 extends along the second direction. The pixel driving circuits of the pixel units in columns of pixel units, which are not the above-mentioned columns of pixel units, share a common first voltage signal lead. For example, the pixel driving circuits of the second column of pixel units and the pixel driving circuits of the third column of pixel units share a common first voltage signal lead VDD2. The pixel driving circuits of the fourth column of pixel units and the pixel driving circuits of the fifth column of pixel units share a common first voltage signal lead VDD2.

As shown in FIG. 9, the display substrate further includes a plurality of first voltage signal lines VDD1 disposed on the base substrate, where the first voltage signal lines VDD1 are electrically connected to the first voltage signal leads VDD2, and specifically, the two may be electrically connected, for example, through a via hole. The plurality of first voltage signal lines VDD1 are arranged at intervals along the second direction, and at least one first voltage signal line VDD1 extends along the first direction That is, the first voltage signal line VDD1 extends along the direction X.

The pixel driving circuits of the pixel units of adjacent rows of pixels share a common first voltage signal line VDD1. The pixel units of the adjacent row pixels are not the pixel units of the above-mentioned adjacent rows of pixels. Here, for example, the pixel driving circuits of the second row of pixel units and the pixel driving circuits of the third row of pixel units share a common first voltage signal line VDD1, and the pixel driving circuits of the fourth row of pixel units and the pixel driving circuits of the fifth row of pixel units share a common first voltage signal line VDD1.

As shown in FIG. 5, the pixel driving circuits of the odd row and the pixel driving circuits of the even row of pixel units are symmetrical with respect to the common initialization voltage signal line Vini1. That is, the driving circuits of the pixel units on both sides of the initialization voltage signal line Vini1 are mutually symmetrical with the initialization voltage signal line Vini1 as an axis of symmetry. For example, the pixel driving circuits of the first row of pixel units and the pixel driving circuits of the second row of pixel units are symmetric with respect to their common initialization voltage signal line Vini1, the pixel driving circuits of the third row of pixel units and the pixel driving circuits of the fourth row of pixel units are symmetric with respect to their common initialization voltage signal line Vini1, and so on.

As shown in FIG. 5 and FIG. 15, the pixel driving circuits of adjacent rows of pixel units are symmetrical with respect to the common first voltage signal line VDD1. That is, the pixel driving circuits of the $2n^{th}$ row of pixel units and the pixel driving circuits of the (2n+1)th row of pixel units are symmetrical with respect to the first voltage signal line VDD1. For example, the pixel driving circuits of the second row of pixel units and the pixel driving circuits of the third row of pixel units are symmetrical with respect to their common first voltage signal line VDD1, the pixel driving circuits of the fourth row of pixel units and the pixel driving circuits of the fifth row of pixel units are symmetrical with respect to their common first voltage signal line VDD1, and so on.

As shown in FIG. 9 and FIG. 15, the pixel driving circuits of the columns of sub-pixels that are close to the common first voltage signal lead in the adjacent columns of pixel units are symmetrical with respect to the common first voltage signal lead VDD2. That is, the pixel driving circuits of the column of sub-pixels that is close to the common first voltage signal lead in the $2m^{th}$ column of pixel units and the pixel driving circuits of the column of sub-pixels that is close to the common first voltage signal lead in the $(2m+1)^{th}$ column of pixel units are symmetrical with respect to the first voltage signal lead VDD2. For example, the pixel driving circuits of the column of sub-pixels that is close to the common first voltage signal lead in the second column of pixel units and the pixel driving circuits of the column of sub-pixels that is close to the common first voltage signal lead in the third column of pixel units are symmetrical with respect to the common first voltage signal lead VDD2. The pixel driving circuits of the column of sub-pixels that is close to the common first voltage signal lead in the fourth column of pixel units and the pixel driving circuits of the column of sub-pixels that is close to the common first voltage signal lead in the fifth column of pixel units are symmetrical with respect to the common first voltage signal lead VDD2.

As shown in FIG. 7, the base substrate further includes a light emission control signal line EM, a first scanning signal line G1, a second scanning signal line G2, a third scanning signal line G3, and a reference voltage signal line Vref1.

A plurality of light emission control signal lines EM are disposed on a side of the base substrate, and the plurality of light emission control signal lines EM are used to respectively provide the light emission control signals to the plurality of rows of pixel units. The plurality of light emission control signal lines EM are arranged at intervals along the second direction Y, and at least one light emission control signal line EM extends along the first direction X.

A plurality of first scanning signal lines G1 are disposed on a side of the base substrate, and the plurality of first scanning signal lines G1 are used to respectively provide the first scanning signals to the plurality of rows of pixel units. The plurality of first scanning signal lines G1 are arranged at intervals along the second direction Y, and at least one first scanning signal line G1 extends along the first direction X.

A plurality of second scanning signal lines G2 are disposed on a side of the base substrate, and the plurality of second scanning signal lines G2 are used to respectively provide the second scanning signals to the plurality of rows of pixel units. The plurality of second scanning signal lines G2 are arranged at intervals along the second direction Y, and at least one second scanning signal line G2 extends along the first direction X.

A plurality of third scanning signal lines G3 are disposed on a side of the base substrate, and the plurality of third scanning signal lines G3 are used to respectively provide the third scanning signals to the plurality of rows of pixel units. The plurality of third scanning signal lines G3 are arranged at intervals along the second direction, and at least one third scanning signal line G3 extends along the first direction.

As shown in FIG. 14, the reference voltage signal line Vref1 is disposed on a side of the base substrate, and the reference voltage signal line Vref1 is electrically connected to the reference voltage signal lead Vref2, for example, through a via hole. A plurality of reference voltage signal lines Vref1 are arranged at intervals along the second direction Y, and at least one reference voltage signal line Vref1 extends along the first direction X.

As shown in FIG. 14, for adjacent rows of pixel units, the first voltage signal lines VDD1, light emission control signal lines EM, first scanning signal lines G1, second scanning signal lines G2, reference voltage signal lines Vref1 and third scanning signal lines G3 of one of two rows of pixel units are located on a side of the common initialization voltage signal line, and the first voltage signal lines VDD1, light emission control signal lines EM, first scanning signal lines G1, second scanning signal lines G2, reference voltage signal lines Vref1 and third scanning signal lines G3 of the other one of the two rows of pixel units are located on another side, which is opposite to the above side in the second direction Y, of the common initialization voltage signal line.

In the embodiments of the present disclosure, as shown in FIG. 7 and FIG. 14, the common initialization voltage signal line Vini1 is spaced from the first voltage signal line VDD1, the light emission control signal line EM, the first scanning signal line G1, the second scanning signal line G2, the reference voltage signal line Vref1 and the third scanning signal line G3 of an odd row of pixel units by gradually decreased distances in the second direction Y.

In the embodiments of the present disclosure, the common initialization voltage signal line Vini1 is spaced from the first voltage signal line VDD1, the light emission control signal line EM, the first scanning signal line G1, the second scanning signal line G2, the reference voltage signal line Vref1 and the third scanning signal line G3 of an even row of pixel units that is adjacent to that odd row of pixel units by gradually decreased distances in the second direction Y.

As described above, the first voltage signal lines VDD1, the light emission control signal lines EM, the first scanning signal lines G1, the second scanning signal lines G2, the reference voltage signal lines Vref1 and the third scanning signal lines G3 of the odd row of pixel units and the even row of pixel units are symmetrical in the second direction Y with the common initialization voltage signal line Vini1 as the axis of symmetry.

As shown in FIG. 12 to FIG. 14, the plurality of sub-pixels on the display substrate include a first sub-pixel, a second sub-pixel and a third sub-pixel. For example, the first sub-pixel may be a red sub-pixel R, the second sub-pixel may be a green sub-pixel G, and the third sub-pixel may be a blue sub-pixel B. The display substrate further includes a first data lead DR, a second data lead DG, and a third data lead DB. As shown in FIG. 9 and FIG. 14, the first data lead DR, the second data lead DG, and the third data lead DB may be disposed in the third conductive layer 40. The first data leads DR respectively provide first data signals to a plurality of columns of first sub-pixels R, the plurality of first data leads DR are arranged at intervals along the first direction X, and at least one first data lead DR extends along the second direction Y. The second data leads DG respectively provide second data signals to a plurality of columns of second sub-pixels G, the plurality of second data leads DG are arranged at intervals along the first direction X, and at least one second data lead DG extends along the second direction Y. The third data leads DB respectively provide third data signals to a plurality of columns of third sub-pixels B, the plurality of third data leads DB are arranged at intervals along the first direction X, and at least one third data lead DB extends along the second direction Y.

Exemplarily, each first data lead DR extending along the second direction Y supplies a first data signal for each column of first sub-pixels R, each second data lead DG extending along the second direction Y supplies a second data signal for each column of second sub-pixels G, and each third data lead DB extending along the second direction Y supplies a first data signal for each column of first sub-pixels B.

As shown in FIG. 9 and FIG. 14, for an odd column of pixel units and an even column of pixel units (e.g., the first columns of pixel units and second columns of pixel units), the first voltage signal leads VDD2, first data leads DR, second data leads DG, and third data leads DB of one of two adjacent columns of pixel units are located on a side of the common initialization voltage signal lead Vini2 away from the common reference voltage signal lead Vref2 in the first direction X, and the the first voltage signal leads VDD2, first data leads DR, second data leads DG, and third data leads DB of the other one of the two adjacent columns of pixel units are located on a side of the common reference voltage signal lead Vref2 away from the common initialization voltage signal lead Vini2 in the first direction X.

In the embodiments of the present disclosure, as shown in FIG. 9 and FIG. 14, the first voltage signal lead VDD2, the first data lead DR, the second data lead DG and the third data lead DB of an odd column (e.g., the first column) of pixel units are located on a side of the common initialization voltage signal lead Vini2 away from the common reference voltage signal lead Vref2. For that odd column of pixel units, the common initialization voltage signal lead Vini2 is spaced from the first voltage signal lead VDD2, the first data lead DR, the second data lead DG, and the third data lead DB by gradually decreased distances in the first direction X. The first voltage signal lead VDD2, the first data lead DR, the second data lead DG, and the third data lead DB of an even column of pixel units that is adjacent to that odd column of pixel units and shares the common initialization voltage signal lead Vini2 with that odd column of pixel units are located on a side of the common reference voltage signal lead Vref2 away from the common initialization voltage signal lead Vini2. For that even column of pixel units, the common reference voltage signal lead Vref2 is spaced from the first data lead DR, the common reference voltage signal lead Vref2, the third data lead DB and the first voltage signal lead VDD2 by gradually increased distances in the first direction X.

In the embodiments of the present disclosure, as shown in FIG. 5, the first voltage signal line VDD1, the reference voltage signal line Vref1 and the initialization voltage signal line Vini1 are located in the first conductive layer 10.

As shown in FIG. 7 and FIG. 16, the light emission control signal line EM, the first scanning signal line G1, the second scanning signal line G2 and the third scanning signal line G3 are located in the second conductive layer 30. The first conductive layer 10 and the second conductive layer 30 are different conductive layers disposed on the base substrate. For example, other layers, such as an insulating layer and the semiconductor layer 20, may be further disposed between the first conductive layer 10 and the second conductive layer 30.

In the embodiments of the present disclosure, For the same row of pixel units, among the first voltage signal line VDD1, the light emission control signal line EM, the first scanning signal line G1, the second scanning signal line G2, the reference voltage signal line Vref1, the third scanning signal line G3 and the initialization voltage signal line Vini1, in a second direction, the minimum spacing between orthographic projections of two adjacent signal lines in different conductive layers on the base substrate is less than a minimum spacing of orthographic projections of two adjacent signal lines in the same conductive layer on the base substrate.

For example, in different conductive layers, the first voltage signal line VDD1 is adjacent to the light emission control signal line EM, and the minimum spacing between orthographic projections of the first voltage signal line VDD1 and the emission control signal line EM on the base substrate in the second direction Y is d1. In a same conductive layer, the reference voltage signal line Vref1 is adjacent to the initialization voltage signal line Vini1, and the minimum spacing between orthographic projections of the reference voltage signal line Vref1 and the initialization voltage signal line Vini1 on the base substrate in the second direction Y is d2. Accordingly, there is d1 less than d2. According to the embodiments of the present disclosure, by disposing the first voltage signal line VDD1, the light emission control signal line EM, the first scanning signal line G1, the second scanning signal line G2, the reference voltage signal line Vref1, the third scanning signal line G3 and the initialization voltage signal line Vini1 in different conductive layers, and setting the spacing as described above, it is possible to reduce a space occupation of the pixel driving circuits of the pixel units as much as possible, so that a high resolution of the display substrate may be achieved.

As shown in FIG. 16, the display substrate further includes the semiconductor layer 20 and the third conductive layer 40 on the base substrate. The first conductive layer 10, the semiconductor layer 20, the second conductive layer 30, and the third conductive layer 40 are sequentially disposed away from the base substrate. In the embodiments of the present disclosure, other layers, such as an insulating layer, may further be disposed between the first conductive layer 10, the semiconductor layer 20, the second conductive layer 30 and the third conductive layer 40.

In the embodiments of the present disclosure, as shown in FIG. 14, the pixel driving circuit includes a plurality of transistors, such as the first transistor T1, the second transistor T2, the third transistor T3, the fourth transistor T4, and the fifth transistor T5. Each transistor has a source electrode S and a drain electrode D. For example, the first transistor includes a source electrode S1 and a drain electrode D1, the second transistor includes a source electrode S2 and a drain electrode D2, the third transistor includes a source electrode S3 and a drain electrode D3, the fourth transistor includes a source electrode S4 and a drain electrode D4, and the fifth transistor includes a source electrode S5 and a drain electrode D5.

In the embodiments of the present disclosure, as shown in FIG. 5 and FIG. 14, the display substrate further includes a light shielding portion LS, and the pixel driving circuit includes a driving transistor (e.g., the fifth transistor T5). The driving transistor includes a channel region, an orthographic projection of the light shielding portion LS on the base substrate covers an orthographic projection of the channel region on the base substrate, and the light shielding portion LS is located in the first conductive layer 10.

As shown in FIG. 7 and FIG. 14, the driving transistor further includes a gate electrode Ga in the second conductive layer 30, which is used for controlling the on state of the driving transistor.

In the embodiments of the present disclosure, as shown in FIG. 16, the pixel driving circuit further includes a storage capacitor (e.g., Cst1 and Cst2), and the storage capacitor includes a first capacitive electrode Cst1 and a second capacitive electrode Cst2. The first capacitive electrode Cst1 includes a first electrode portion C1 in the semiconductor layer, and the second capacitive electrode Cst2 includes a second electrode portion C2 in the first conductive layer and a third electrode portion C3 in the third conductive layer 40. The second electrode portion C2 and the third electrode portion C3 are electrically connected, for example, through a third via hole VH3.

As shown in FIG. 16, an orthographic projection of the first electrode portion C1 on the base substrate 1 at least partially overlaps with an orthographic projection of the second electrode portion C2 on the base substrate 1, and an orthographic projection of the first electrode portion C1 on the base substrate 1 at least partially overlaps with an orthographic projection of the third electrode portion C3 on the base substrate 1. As such, the formed storage capacitor has a large surface area between the first capacitive electrode and the second capacitive electrode, thereby permitting a large storage capacity.

As shown in FIG. 8, the gate electrode of the driving transistor T5 is electrically connected with the first electrode portion C1 through a first via hole VH1. The driving transistor further includes the source electrode S5 and the drain electrode D5. One (e.g., the source electrode S5) of the source electrode S5 and the drain electrode D5 of the driving transistor T5 is electrically connected with the third electrode portion C3 through a second via hole VH2, the second electrode portion C2 is electrically connected with the third electrode portion C3 through the third via hole VH3, and an orthographic projection of the second via hole VH2 on the base substrate at least partially overlaps with an orthographic projection of the third via hole VH3 on the base substrate. The drain electrode D4 of the fourth transistor T4 is electrically connected with the first voltage signal line VDD1 through the third via hole VH3, and the source electrode S4 of the fourth transistor T4 is electrically connected with the drain electrode D5 of the driving transistor T5 through a fifth via hole VH5 and a sixth via hole VH6. Specifically, the source S4 of the fourth transistor is electrically connected with ACT3 in the third conductive layer through the fifth via hole VH5, and ACT3 is electrically connected with the drain electrode D5 of the driving transistor T5 through the sixth via hole VH6. The source electrode S1 of the first transistor T1 is electrically connected with the first data lead DR through a seventh via hole VH7. The source electrode S2 of the second transistor T2 is electrically connected with the reference voltage signal line Vref1 through an eighth via hole VH8 and a ninth via hole VH9, and the drain electrode D2 of the second transistor T2 is electrically connected with the second electrode portion C2. The drain electrode D3 of the third transistor T3 is electrically connected with the second electrode portion C2 through a tenth via hole VH10.

As shown in FIG. 13, the display substrate further includes a pixel defining layer on a side of the third conductive layer 40 away from the base substrate, and a plurality of openings M in the pixel defining layer. The plurality of sub-pixels include the plurality of openings M, respectively, for example, each sub-pixel includes one opening M.

As shown in FIG. 11 and FIG. 13, for two adjacent rows of pixel units, orthographic projections of openings M of sub-pixels of one row of pixel units on the base substrate at least partially overlap with an orthographic projection of the initialization voltage line Vini1 for this row of pixel units on the base substrate, such as the middle row of pixel units shown in FIG. 13. Orthographic projections of openings M of sub-pixels of the other row of pixel units on the base substrate at least partially overlap with an orthographic projection of the first voltage signal line VDD1 for this row of pixel units on the base substrate, such as the lower row of pixel units shown in FIG. 13.

As shown in FIG. 13, the light-emitting element includes a first electrode electrically connected with one of the source electrode S5 and the drain electrode D5 of the driving transistor T5 through an anode connecting hole VHA, and an orthographic projection of the anode connecting hole VHA on the base substrate falls within an orthographic projection of the third electrode portion C3 on the base substrate.

Optionally, according to the embodiments of the present disclosure, there is further provided a display panel, which may include the display substrate described above.

Optionally, according to the embodiments of the present disclosure, there is further provided a display apparatus, which may include the display substrate or the display panel described above. The display apparatus may include but not limited to: electronic paper, a mobile phone, a tablet computer, a television, a display, a laptop, a digital photo frame, a navigator and any other product or component having a display function. It should be understood that the display apparatus has the same beneficial effect as the display substrate provided in the foregoing embodiments.

Although some embodiments of the general concept of the present disclosure have been illustrated and described, those skilled in the art will understand that modifications may be made to these embodiments without departing from the principle and spirit of the general concept of the present disclosure, and the scope of the present disclosure is defined by the claims and the equivalents thereof.

What is claimed is:

1. A display substrate, comprising:
    a base substrate;
    a plurality of pixel units disposed on the base substrate, wherein the plurality of pixel units are arranged in an array along a first direction and a second direction, so as to form a plurality of rows of pixel units and a plurality of columns of pixel units, at least one of the pixel units comprises a plurality of sub-pixels, and at least one of the sub-pixels comprises a light-emitting element and a pixel driving circuit for driving the light-emitting element;
    a plurality of initialization voltage signal lines disposed on the base substrate, and configured to provide initialization voltage signals to the plurality of rows of pixel units respectively, wherein the plurality of initialization voltage signal lines are arranged at intervals along the second direction, and at least one of the initialization voltage signal lines extends along the first direction; and
    a plurality of initialization voltage signal leads disposed on the base substrate, electrically connected with the initialization voltage signal lines, wherein the plurality of initialization voltage signal leads are arranged at intervals along the first direction, and at least one of the initialization voltage signal leads extends along the second direction,
    wherein the plurality of rows of pixel units comprise a $(2n-1)^{th}$ row of pixel units and a $2n^{th}$ row of pixel units, n being a positive integer, and pixel driving circuits of the $(2n-1)^{th}$ row of pixel units and pixel driving circuits of the $2n^{th}$ row of pixel units share a common initialization voltage signal line; and wherein the plurality of columns of pixel units comprise a (2m−1)th column of pixel units and a 2mth column of pixel units, m being a positive integer, and pixel driving circuits of the (2m−1)th column of pixel units and pixel driving circuits of the 2mth column of pixel units share a common initialization voltage signal lead.

2. The display substrate according to claim 1, further comprising: a plurality of reference voltage signal leads disposed on the base substrate, configured to provide a reference voltage, wherein the plurality of reference voltage signal leads are arranged at intervals along the first direction, and at least one of the reference voltage signal leads extends along the second direction; and pixel driving circuits of a $(2m-1)^{th}$ column of pixel units and pixel driving circuits of a $2m^{th}$ column of pixel units share a common reference voltage signal lead.

3. The display substrate according to claim 2, further comprising: a plurality of first voltage signal leads disposed on the base substrate, configured to provide a first voltage to the light-emitting element, wherein the plurality of first voltage signal leads are arranged at intervals along the first direction, and at least one of the first voltage signal leads extends along the second direction; and the plurality of columns of pixel units further comprise a $(2m+1)^{th}$ column of pixel units, and the pixel driving circuits of the $2m^{th}$ column of pixel units and pixel driving circuits of the $(2m+1)^{th}$ column of pixel units share a common first voltage signal lead.

4. The display substrate according to claim 3, further comprising: a plurality of first voltage signal lines disposed on the base substrate, electrically connected with the first voltage signal leads, wherein the plurality of first voltage signal lines are arranged at intervals along the second direction, and at least one of the first voltage signal lines extends along the first direction; and the plurality rows of pixel units further comprise a $(2+1)^{th}$ row of pixel units, and the pixel driving circuits of the $2n^{th}$ row of pixel units and pixel driving circuits of the $(2+1)^{th}$ row of pixel units share a common first voltage signal line.

5. The display substrate according to claim 4, wherein the pixel driving circuits of the $2n^{th}$ row of pixel units and the pixel driving circuits of the $(2n+1)^{th}$ row of pixel units are symmetrical with respect to the common first voltage signal line.

6. The display substrate according to claim 3, wherein pixel driving circuits of a column of sub-pixels close to the common first voltage signal lead in the $2m^{th}$ column of pixel units and pixel driving circuits of a column of sub-pixels close to the common first voltage signal lead in the $(2m+1)^{th}$ column of pixel units are symmetrical with respect to the common first voltage signal lead.

7. The display substrate according to claim 4, further comprising:

a plurality of light emission control signal lines disposed on the base substrate, configured to provide light emission control signals to the plurality of rows of pixel units respectively, wherein the plurality of light emission control signal lines are arranged at intervals along the second direction, and at least one of the light emission control signal lines extends along the first direction;

a plurality of first scanning signal lines disposed on the base substrate, configured to provide first scanning signals to the plurality of rows of pixel units respectively, wherein the plurality of first scanning signal lines are arranged at intervals along the second direction, and at least one of the first scanning signal lines extends along the first direction;

a plurality of second scanning signal lines disposed on the base substrate, configured to provide second scanning signals to the plurality of rows of pixel units respectively, wherein the plurality of second scanning signal lines are arranged at intervals along the second direction, and at least one of the second scanning signal lines extends along the first direction;

a plurality of reference voltage signal lines disposed on the base substrate, electrically connected with the reference voltage signal leads, wherein the plurality of reference voltage signal lines are arranged at intervals along the second direction, and at least one of the reference voltage signal lines extends along the first direction; and a plurality of third scanning signal lines disposed on the base substrate, configured to provide third scanning signals to the plurality of rows of pixel units respectively, wherein the plurality of third scanning signal lines are arranged at intervals along the second direction, and at least one of the third scanning signal lines extends along the first direction.

8. The display substrate according to claim 7, wherein the light emission control signal line, the first scanning signal line, the second scanning signal line, the reference voltage signal line and the third scanning signal line of the $(2n-1)^{th}$ row of pixel units are located on a side of the common initialization voltage signal line, and the first voltage signal line, the light emission control signal line, the first scanning signal line, the second scanning signal line, the reference voltage signal line and the third scanning signal line of the $2n^{th}$ row of pixel units are located on another side, which is opposite to the side in the second direction, of the common initialization voltage signal line.

9. The display substrate according to claim 7, wherein the common initialization voltage signal line is spaced from the first voltage signal line, the light emission control signal line, the first scanning signal line, the second scanning signal line, the reference voltage signal line and the third scanning signal line of the $(2n-1)^{th}$ row of pixel units by gradually decreased distances in the second direction; and/or the common initialization voltage signal line is spaced from the first voltage signal line, the light emission control signal line, the first scanning signal line, the second scanning signal line, the reference voltage signal line and the third scanning signal line of the $2n^{th}$ row of pixel units by gradually decreased distances in the second direction.

10. The display substrate according to claim 7, wherein the plurality of sub-pixels comprise a first sub-pixel, a second sub-pixel, and a third sub-pixel; and the display substrate further comprises:

a plurality of first data leads disposed on the base substrate, configured to provide first data signals to a plurality of columns of the first sub-pixels respectively, wherein the plurality of first data leads are arranged at intervals along the first direction, and at least one of the first data leads extends along the second direction;

a plurality of second data leads disposed on the base substrate, configured to provide second data signals to a plurality of columns of the second sub-pixels respectively, wherein the plurality of second data leads are arranged at intervals along the first direction, and at least one of the second data leads extends along the second direction; and a plurality of third data leads disposed on the base substrate, configured to provide third data signals to a plurality of columns of the third sub-pixels respectively, wherein the plurality of third data leads are arranged at intervals along the first direction, and at least one of the third data leads extends along the second direction.

11. The display substrate according to claim 10, wherein for the $(2m-1)^{th}$ column of pixel units and the $2m^{th}$ column of pixel units, the first voltage signal lead, the first data lead, the second data lead and the third data lead of one column of pixel units is located on a side of the common initialization voltage signal lead away from the common reference voltage signal lead in the first direction, and the first voltage signal lead, the first data lead, the second data lead and the third data lead of the other column of pixel units are located on a side of the common reference voltage signal lead away from the common initialization voltage signal lead in the first direction.

12. The display substrate according to claim 10, wherein the first voltage signal lead, the first data lead the second data lead and the third data lead of the $(2m-1)^{th}$ column of pixel units are located on a side of the common initialization voltage signal lead away from the common reference voltage signal lead, and the common initialization voltage signal lead is spaced from the first voltage signal lead, the first data lead, the second data lead and the third data lead of the $(2m-1)^{th}$ column of pixel units by gradually decreased distances in the first direction; and/or
the first voltage signal lead, the first data lead, the second data lead and the third data lead of the $2m^{th}$ column of pixel units are located on a side of the common reference voltage signal lead away from the common initialization voltage signal lead, and the common reference voltage signal lead is spaced from the first data lead, the second data lead, the third data lead and the first voltage signal lead of the $2m^{th}$ column of pixel units by gradually increased distances in the first direction.

13. The display substrate according to claim 12, wherein the first voltage signal lines, the reference voltage signal lines, and the initialization voltage signal lines are located in a first conductive layer; and
the light emission control signal lines, the first scanning signal lines, the second scanning signal lines and the third scanning signal lines are located in a second conductive layer, and the first conductive layer and the second conductive layer are different conductive layers disposed on the base substrate.

14. The display substrate according to claim 13, further comprising a semiconductor layer and a third conductive layer on the base substrate, wherein the first conductive layer, the semiconductor layer, the second conductive layer and the third conductive layer are disposed away from the base substrate sequentially;
the display substrate further comprises a light shielding portion, and the pixel driving circuit comprises a driving transistor, wherein the driving transistor comprises a channel region, and an orthographic projection of the light shielding portion on the base substrate covers an orthographic projection of the channel region on the base substrate; and
the light shielding portion is located in the first conductive layer.

15. The display substrate according to claim 14, wherein the driving transistor further comprises a gate electrode in the second conductive layer;

wherein the pixel driving circuit further comprises a storage capacitor, and the storage capacitor comprises a first capacitive electrode and a second capacitive electrode, wherein the first capacitive electrode comprises a first electrode portion in the semiconductor layer, the second capacitive electrode comprises a second electrode portion in the first conductive layer and a third electrode portion in the third conductive layer, and the second electrode portion are electrically connected with the third electrode portion; and
an orthographic projection of the first electrode portion on the base substrate at least partially overlaps with an orthographic projection of the second electrode portion on the base substrate, and the orthographic projection of the first electrode portion on the base substrate at least partially overlaps with an orthographic projection of the third electrode portion on the base substrate;
wherein a gate electrode of the driving transistor is electrically connected with the first electrode portion through a first via hole; and/or
the driving transistor further comprises a source electrode and a drain electrode, one of the source electrode and the drain electrode of the driving transistor is electrically connected with the third electrode portion through a second via hole, the second electrode portion is electrically connected with the third electrode portion through a third via hole, and an orthographic projection of the second via hole on the base substrate at least partially overlap with an orthographic projection of the third via hole on the base substrate;
wherein the light-emitting element comprises a first electrode electrically connected with one of the source electrode and the drain electrode of the driving transistor through an anode connecting hole; and
an orthographic projection of the anode connecting hole on the base substrate is within the orthographic projection of the third electrode portion on the base substrate;
wherein the pixel driving circuit further comprises a first transistor, a second transistor, a third transistor and a fourth transistor, and each of the first transistor, the second transistor, the third transistor and the fourth transistor comprises a gate electrode, a source electrode and a drain electrode;
one of the source electrode and the drain electrode of the first transistor is electrically connected with the gate electrode of the driving transistor;
one of the source electrode and the drain electrode of the second transistor is electrically connected with the gate electrode of the driving transistor;
one of the source electrode and the drain electrode of the third transistor is electrically connected with the second capacitive electrode; and
one of the source electrode and the drain electrode of the fourth transistor is electrically connected with the other one of the source electrode and the drain electrode of the driving transistor;
wherein the gate electrode of the first transistor is electrically connected with the first scanning signal line, and one of the first data lead, the second data lead and the third data lead is electrically connected with the other one of the source electrode and the drain electrode of the first transistor; and/or
the gate electrode of the second transistor is electrically connected with the second scanning signal line, and the other one of the source electrode and the drain electrode of the second transistor is electrically connected with the reference voltage signal line; and/or the gate electrode of the third transistor is electrically connected with the third scanning signal line, and the other one of the source electrode and the drain electrode of the third transistor is electrically connected with the initialization voltage signal line; and/or the gate electrode of the fourth transistor is electrically connected with the light emission control signal line, and the other one of the source electrode and the drain electrode of the fourth transistor is electrically connected with the first voltage signal line.

16. The display substrate according to claim 14, further comprising: a pixel defining layer on a side of the third conductive layer away from the base substrate, and a plurality of openings in the pixel defining layer, wherein the plurality of sub-pixels comprise the plurality of openings respectively; and for two adjacent rows of pixel units, orthographic projections of the openings of the sub-pixels of one row of pixel units on the base substrate at least partially overlap with an orthographic projection of the initialization voltage line for the row of pixel units on the base substrate, and orthographic projections of the openings of the sub-pixels of the other row of pixel units on the base substrate at least partially overlap with an orthographic projection of the first voltage signal line for the other row of pixel units on the base substrate.

17. The display substrate according to claim 7, wherein among the first voltage signal line, the light emission control signal line, the first scanning signal line, the second scanning signal line, the reference voltage signal line, the third scanning signal line, and the initialization voltage signal line of a same row of pixel units, in the second direction, a minimum spacing between orthographic projections of two adjacent signal lines in different conductive layers on the base substrate is less than a minimum spacing of orthographic projections of two adjacent signal lines in a same conductive layer on the base substrate.

18. The display substrate according to claim 1, wherein the pixel driving circuits of the $(2n-1)^{th}$ row of pixel units and the pixel driving circuits of the $2n^{th}$ row of pixel units are symmetrical with respect to the common initialization voltage signal line.

19. A display panel, comprising the display substrate according to claim 1.

* * * * *